(12) United States Patent
Zohni et al.

(10) Patent No.: US 8,730,670 B1
(45) Date of Patent: May 20, 2014

(54) EMBOSSED HEAT SPREADER

(75) Inventors: Wael O. Zohni, San Jose, CA (US);
William Schmidt, Los Gatos, CA (US);
Michael J. S. Smith, Palo Alto, CA
(US); Jeremy Matthew Plunkett, San Jose, CA (US)

(73) Assignee: Google Inc., Mountain View, CA (US)

( * ) Notice: Subject to any disclaimer, the term of this patent is extended or adjusted under 35 U.S.C. 154(b) by 283 days.

(21) Appl. No.: 13/279,068

(22) Filed: Oct. 21, 2011

Related U.S. Application Data

(62) Division of application No. 12/203,100, filed on Sep. 2, 2008, now Pat. No. 8,081,474.

(60) Provisional application No. 61/014,740, filed on Dec. 18, 2007.

(51) Int. Cl.
*H05K 7/20* (2006.01)

(52) U.S. Cl.
USPC ............ 361/690; 361/704; 361/708; 361/721

(58) Field of Classification Search
USPC ....................................................... 361/721
See application file for complete search history.

(56) References Cited

U.S. PATENT DOCUMENTS

| | | |
|---|---|---|
| 3,800,292 A | 3/1974 | Curley et al. |
| 4,069,452 A | 1/1978 | Conway et al. |
| 4,323,965 A | 4/1982 | Johnson et al. |
| 4,334,307 A | 6/1982 | Bourgeois et al. |
| 4,345,319 A | 8/1982 | Bernardini et al. |
| 4,392,212 A | 7/1983 | Miyasaka et al. ............. 365/230 |
| 4,500,958 A | 2/1985 | Manton et al. |
| 4,525,921 A | 7/1985 | Carson et al. |
| 4,566,082 A | 1/1986 | Anderson |
| 4,592,019 A | 5/1986 | Huang et al. |
| 4,628,407 A * | 12/1986 | August et al. ................ 361/711 |
| 4,646,128 A | 2/1987 | Carson et al. |
| 4,698,748 A | 10/1987 | Juzswik et al. |
| 4,706,166 A | 11/1987 | Go |
| 4,710,903 A | 12/1987 | Hereth et al. |
| 4,764,846 A | 8/1988 | Go |
| 4,780,843 A | 10/1988 | Tietjen |
| 4,794,597 A | 12/1988 | Ooba et al. |

(Continued)

FOREIGN PATENT DOCUMENTS

| | | |
|---|---|---|
| DE | 102004051345 | 5/2006 |
| DE | 102004053316 | 5/2006 |

(Continued)

OTHER PUBLICATIONS

Final Office Action from U.S. Appl. No. 11/672,924, Dated Feb. 1, 2013.

(Continued)

*Primary Examiner* — Gregory Thompson
(74) *Attorney, Agent, or Firm* — Fish & Richardson P.C.

(57) ABSTRACT

One embodiment of the present invention sets forth a heat spreader module for dissipating thermal heat generated by electronic components. The assembly comprises a printed circuit board (PCB), electronic components disposed on the PCB, a thermal interface material (TIM) thermally coupled to the electronic components, and a heat spreader plate thermally coupled to the TIM. The heat spreader plate includes an embossed pattern. Consequently, surface area available for heat conduction between the heat spreader plate and surrounding medium may be increased relative to the prior art designs.

18 Claims, 13 Drawing Sheets

(56) References Cited

U.S. PATENT DOCUMENTS

| | | | |
|---|---|---|---|
| 4,796,232 A | 1/1989 | House | 365/189 |
| 4,807,191 A | 2/1989 | Flannagan | |
| 4,841,440 A | 6/1989 | Yonezu et al. | |
| 4,862,347 A | 8/1989 | Rudy | |
| 4,884,237 A | 11/1989 | Mueller et al. | |
| 4,887,240 A | 12/1989 | Garverick et al. | 361/222 |
| 4,888,687 A | 12/1989 | Allison et al. | |
| 4,899,107 A | 2/1990 | Corbett et al. | |
| 4,912,678 A | 3/1990 | Mashiko | |
| 4,916,575 A * | 4/1990 | Van Asten | 361/715 |
| 4,922,451 A | 5/1990 | Lo et al. | |
| 4,935,734 A | 6/1990 | Austin | |
| 4,937,791 A | 6/1990 | Steele et al. | |
| 4,956,694 A | 9/1990 | Eide | |
| 4,982,265 A | 1/1991 | Watanabe et al. | |
| 4,983,533 A | 1/1991 | Go | |
| 5,025,364 A | 6/1991 | Zellmer | |
| 5,072,424 A | 12/1991 | Brent et al. | 365/189 |
| 5,083,266 A | 1/1992 | Watanabe | |
| 5,104,820 A | 4/1992 | Go et al. | |
| 5,193,072 A | 3/1993 | Frenkil et al. | |
| 5,212,666 A | 5/1993 | Takeda | |
| 5,220,672 A | 6/1993 | Nakao et al. | |
| 5,222,014 A | 6/1993 | Lin | |
| 5,241,266 A | 8/1993 | Ahmad et al. | |
| 5,252,807 A | 10/1993 | Chizinsky | |
| 5,257,233 A | 10/1993 | Schaefer | |
| 5,278,796 A | 1/1994 | Tillinghast et al. | |
| 5,282,177 A | 1/1994 | McLaury | |
| 5,332,922 A | 7/1994 | Oguchi et al. | 257/723 |
| 5,347,428 A | 9/1994 | Carson et al. | |
| 5,369,749 A | 11/1994 | Baker et al. | |
| 5,384,745 A | 1/1995 | Konishi et al. | |
| 5,388,265 A | 2/1995 | Volk | |
| 5,390,078 A * | 2/1995 | Taylor | 361/721 |
| 5,390,334 A | 2/1995 | Harrison | |
| 5,392,251 A | 2/1995 | Manning | |
| 5,408,190 A | 4/1995 | Wood et al. | |
| 5,432,729 A | 7/1995 | Carson et al. | |
| 5,448,511 A | 9/1995 | Paurus et al. | |
| 5,467,455 A | 11/1995 | Gay et al. | |
| 5,483,497 A | 1/1996 | Mochizuki et al. | |
| 5,498,886 A | 3/1996 | Hsu et al. | 257/213 |
| 5,502,333 A | 3/1996 | Bertin et al. | |
| 5,502,667 A | 3/1996 | Bertin et al. | |
| 5,513,135 A | 4/1996 | Dell et al. | |
| 5,513,339 A | 4/1996 | Agrawal et al. | |
| 5,519,832 A | 5/1996 | Warchol | |
| 5,526,320 A | 6/1996 | Zagar et al. | |
| 5,530,836 A | 6/1996 | Busch et al. | |
| 5,559,990 A | 9/1996 | Cheng et al. | |
| 5,561,622 A | 10/1996 | Bertin et al. | |
| 5,563,086 A | 10/1996 | Bertin et al. | |
| 5,566,344 A | 10/1996 | Hall et al. | |
| 5,581,498 A | 12/1996 | Ludwig et al. | |
| 5,581,779 A | 12/1996 | Hall et al. | |
| 5,590,071 A | 12/1996 | Kolor et al. | |
| 5,598,376 A | 1/1997 | Merritt et al. | |
| 5,604,714 A | 2/1997 | Manning et al. | |
| 5,606,710 A | 2/1997 | Hall et al. | |
| 5,608,262 A | 3/1997 | Degani et al. | |
| 5,610,864 A | 3/1997 | Manning | |
| 5,623,686 A | 4/1997 | Hall et al. | |
| 5,627,791 A | 5/1997 | Wright et al. | |
| 5,640,337 A | 6/1997 | Huang et al. | |
| 5,640,364 A | 6/1997 | Merritt et al. | |
| 5,652,724 A | 7/1997 | Manning | |
| 5,654,204 A | 8/1997 | Anderson | |
| 5,661,677 A | 8/1997 | Rondeau et al. | |
| 5,661,695 A | 8/1997 | Zagar et al. | |
| 5,668,773 A | 9/1997 | Zagar et al. | |
| 5,675,549 A | 10/1997 | Ong et al. | |
| 5,680,342 A | 10/1997 | Frankeny | |
| 5,682,354 A | 10/1997 | Manning | |
| 5,692,121 A | 11/1997 | Bozso et al. | |
| 5,692,202 A | 11/1997 | Kardach et al. | |
| 5,696,732 A | 12/1997 | Zagar et al. | |
| 5,696,929 A | 12/1997 | Hasbun et al. | |
| 5,702,984 A | 12/1997 | Bertin et al. | |
| 5,703,813 A | 12/1997 | Manning et al. | |
| 5,706,247 A | 1/1998 | Merritt et al. | |
| RE35,733 E | 2/1998 | Hernandez et al. | |
| 5,717,654 A | 2/1998 | Manning | |
| 5,721,859 A | 2/1998 | Manning | |
| 5,724,288 A | 3/1998 | Cloud et al. | |
| 5,729,503 A | 3/1998 | Manning | |
| 5,729,504 A | 3/1998 | Cowles | 365/236 |
| 5,742,792 A | 4/1998 | Yanai et al. | |
| 5,748,914 A | 5/1998 | Barth et al. | |
| 5,752,045 A | 5/1998 | Chen | |
| 5,757,703 A | 5/1998 | Merritt et al. | |
| 5,761,703 A | 6/1998 | Bolyn | 711/106 |
| 5,781,766 A | 7/1998 | Davis | |
| 5,787,457 A | 7/1998 | Miller et al. | |
| 5,798,961 A | 8/1998 | Heyden et al. | |
| 5,802,010 A | 9/1998 | Zagar et al. | |
| 5,802,395 A | 9/1998 | Connolly et al. | |
| 5,802,555 A | 9/1998 | Shigeeda | 711/106 |
| 5,812,488 A | 9/1998 | Zagar et al. | |
| 5,818,788 A | 10/1998 | Kimura et al. | |
| 5,819,065 A | 10/1998 | Chilton et al. | |
| 5,831,833 A | 11/1998 | Shirakawa et al. | |
| 5,831,931 A | 11/1998 | Manning | |
| 5,831,932 A | 11/1998 | Merritt et al. | |
| 5,834,838 A | 11/1998 | Anderson | |
| 5,835,435 A | 11/1998 | Bogin et al. | |
| 5,838,165 A | 11/1998 | Chatter | |
| 5,838,177 A | 11/1998 | Keeth | |
| 5,841,580 A | 11/1998 | Farmwald et al. | 365/194 |
| 5,843,799 A | 12/1998 | Hsu et al. | 438/6 |
| 5,843,807 A | 12/1998 | Burns | |
| 5,845,108 A | 12/1998 | Yoo et al. | |
| 5,850,368 A | 12/1998 | Ong et al. | |
| 5,859,792 A | 1/1999 | Rondeau et al. | |
| 5,860,106 A | 1/1999 | Domen et al. | |
| 5,870,347 A | 2/1999 | Keeth et al. | |
| 5,870,350 A | 2/1999 | Bertin | |
| 5,872,907 A | 2/1999 | Griess et al. | |
| 5,875,142 A | 2/1999 | Chevallier | |
| 5,878,279 A | 3/1999 | Athenes | |
| 5,884,088 A | 3/1999 | Kardach et al. | |
| 5,901,105 A | 5/1999 | Ong et al. | |
| 5,903,500 A | 5/1999 | Tsang et al. | |
| 5,905,688 A | 5/1999 | Park | |
| 5,907,512 A | 5/1999 | Parkinson et al. | |
| 5,913,072 A | 6/1999 | Wierenga | |
| 5,915,105 A | 6/1999 | Farmwald et al. | |
| 5,915,167 A | 6/1999 | Leedy | |
| 5,917,758 A | 6/1999 | Keeth | |
| 5,923,611 A | 7/1999 | Ryan | |
| 5,924,111 A | 7/1999 | Huang et al. | |
| 5,926,435 A | 7/1999 | Park et al. | |
| 5,929,650 A | 7/1999 | Pappert et al. | |
| 5,943,254 A | 8/1999 | Bakeman, Jr. et al. | |
| 5,946,265 A | 8/1999 | Cowles | |
| 5,949,254 A | 9/1999 | Keeth | |
| 5,953,215 A | 9/1999 | Karabatsos | |
| 5,953,263 A | 9/1999 | Farmwald et al. | |
| 5,954,804 A | 9/1999 | Farmwald et al. | |
| 5,956,233 A | 9/1999 | Yew et al. | |
| 5,963,429 A | 10/1999 | Chen | |
| 5,963,463 A | 10/1999 | Rondeau et al. | |
| 5,963,464 A | 10/1999 | Dell et al. | |
| 5,963,504 A | 10/1999 | Manning | |
| 5,966,724 A | 10/1999 | Ryan | |
| 5,966,727 A | 10/1999 | Nishino | |
| 5,969,996 A | 10/1999 | Muranaka et al. | 365/189 |
| 5,973,392 A | 10/1999 | Senba et al. | |
| 5,978,304 A | 11/1999 | Crafts | |
| 5,995,424 A | 11/1999 | Lawrence et al. | |
| 5,995,443 A | 11/1999 | Farmwald et al. | |
| 6,001,671 A | 12/1999 | Fjelstad | |
| 6,002,613 A | 12/1999 | Cloud et al. | |
| 6,002,627 A | 12/1999 | Chevallier | |

(56) References Cited

U.S. PATENT DOCUMENTS

| | | | |
|---|---|---|---|
| 6,014,339 A | 1/2000 | Kobayashi et al. | |
| 6,016,282 A | 1/2000 | Keeth | |
| 6,026,027 A | 2/2000 | Terrell, II et al. | |
| 6,026,050 A | 2/2000 | Baker et al. | 365/233 |
| 6,029,250 A | 2/2000 | Keeth | 713/400 |
| 6,032,214 A | 2/2000 | Farmwald et al. | |
| 6,032,215 A | 2/2000 | Farmwald et al. | |
| 6,034,916 A | 3/2000 | Lee | |
| 6,034,918 A | 3/2000 | Farmwald et al. | |
| 6,035,365 A | 3/2000 | Farmwald et al. | |
| 6,038,195 A | 3/2000 | Farmwald et al. | |
| 6,038,673 A | 3/2000 | Benn et al. | |
| 6,044,032 A | 3/2000 | Li | |
| 6,047,073 A | 4/2000 | Norris et al. | |
| 6,047,344 A | 4/2000 | Kawasumi et al. | |
| 6,047,361 A | 4/2000 | Ingenio et al. | |
| 6,053,948 A | 4/2000 | Vaidyanathan et al. | 703/14 |
| 6,058,451 A | 5/2000 | Bermingham et al. | |
| 6,065,092 A | 5/2000 | Roy | |
| 6,069,504 A | 5/2000 | Keeth | |
| 6,070,217 A | 5/2000 | Connolly et al. | |
| 6,073,223 A | 6/2000 | McAllister et al. | |
| 6,075,730 A | 6/2000 | Barth et al. | |
| 6,075,744 A | 6/2000 | Tsern et al. | 365/230 |
| 6,078,546 A | 6/2000 | Lee | |
| 6,079,025 A | 6/2000 | Fung | |
| 6,084,434 A | 7/2000 | Keeth | |
| 6,088,290 A | 7/2000 | Ohtake et al. | |
| 6,091,251 A | 7/2000 | Wood et al. | |
| RE36,839 E | 8/2000 | Simmons et al. | |
| 6,101,152 A | 8/2000 | Farmwald et al. | |
| 6,101,564 A | 8/2000 | Athenes et al. | |
| 6,101,612 A | 8/2000 | Jeddeloh | |
| 6,108,795 A | 8/2000 | Jeddeloh | |
| 6,111,812 A | 8/2000 | Gans et al. | 365/233 |
| 6,125,072 A | 9/2000 | Wu | |
| 6,134,638 A | 10/2000 | Olarig et al. | 711/167 |
| 6,154,370 A | 11/2000 | Degani et al. | |
| 6,166,991 A | 12/2000 | Phelan | |
| 6,181,640 B1 | 1/2001 | Kang | |
| 6,182,184 B1 | 1/2001 | Farmwald et al. | |
| 6,199,151 B1 | 3/2001 | Williams et al. | |
| 6,208,168 B1 | 3/2001 | Rhee | |
| 6,216,246 B1 | 4/2001 | Shau | 714/763 |
| 6,222,739 B1 | 4/2001 | Bhakta et al. | |
| 6,226,709 B1 | 5/2001 | Goodwin et al. | |
| 6,226,730 B1 | 5/2001 | Murdoch et al. | |
| 6,233,192 B1 | 5/2001 | Tanaka | |
| 6,233,650 B1 | 5/2001 | Johnson et al. | |
| 6,240,048 B1 | 5/2001 | Matsubara | |
| 6,243,282 B1 | 6/2001 | Rondeau et al. | |
| 6,252,807 B1 | 6/2001 | Suzuki et al. | |
| 6,253,278 B1 | 6/2001 | Ryan | |
| 6,260,097 B1 | 7/2001 | Farmwald et al. | |
| 6,260,154 B1 | 7/2001 | Jeddeloh | |
| 6,262,938 B1 | 7/2001 | Lee et al. | |
| 6,266,285 B1 | 7/2001 | Farmwald et al. | |
| 6,266,292 B1 | 7/2001 | Tsern et al. | 365/230 |
| 6,274,395 B1 | 8/2001 | Weber | |
| 6,279,069 B1 | 8/2001 | Robinson et al. | 711/103 |
| 6,295,572 B1 | 9/2001 | Wu | |
| 6,297,966 B1 | 10/2001 | Lee et al. | |
| 6,298,426 B1 | 10/2001 | Ajanovic | |
| 6,304,511 B1 | 10/2001 | Gans et al. | 365/233 |
| 6,307,769 B1 | 10/2001 | Nuxoll et al. | |
| 6,314,051 B1 | 11/2001 | Farmwald et al. | |
| 6,317,352 B1 | 11/2001 | Halbert et al. | 365/52 |
| 6,317,381 B1 | 11/2001 | Gans et al. | 365/233 |
| 6,324,120 B2 | 11/2001 | Farmwald et al. | |
| 6,326,810 B1 | 12/2001 | Keeth | |
| 6,327,664 B1 | 12/2001 | Dell et al. | |
| 6,330,683 B1 | 12/2001 | Jeddeloh | |
| 6,336,174 B1 | 1/2002 | Li et al. | |
| 6,338,108 B1 | 1/2002 | Motomura | |
| 6,338,113 B1 | 1/2002 | Kubo et al. | |
| 6,341,347 B1 | 1/2002 | Joy et al. | 712/228 |
| 6,343,019 B1 | 1/2002 | Jiang et al. | |
| 6,343,042 B1 | 1/2002 | Tsern et al. | 365/222 |
| 6,353,561 B1 | 3/2002 | Funyu et al. | |
| 6,356,105 B1 | 3/2002 | Volk | |
| 6,356,500 B1 | 3/2002 | Cloud et al. | |
| 6,362,656 B2 | 3/2002 | Rhee | |
| 6,363,031 B2 | 3/2002 | Phelan | |
| 6,378,020 B2 | 4/2002 | Farmwald et al. | |
| 6,381,188 B1 | 4/2002 | Choi et al. | |
| 6,381,668 B1 | 4/2002 | Lunteren | |
| 6,389,514 B1 | 5/2002 | Rokicki | |
| 6,392,304 B1 | 5/2002 | Butler | |
| 6,414,868 B1 | 7/2002 | Wong et al. | 365/51 |
| 6,418,034 B1 | 7/2002 | Weber et al. | |
| 6,421,754 B1 | 7/2002 | Kau et al. | |
| 6,424,532 B2 | 7/2002 | Kawamura | |
| 6,426,916 B2 | 7/2002 | Farmwald et al. | |
| 6,429,029 B1 | 8/2002 | Eldridge et al. | |
| 6,430,103 B2 | 8/2002 | Nakayama et al. | |
| 6,434,660 B1 | 8/2002 | Lambert et al. | |
| 6,437,600 B1 | 8/2002 | Keeth | |
| 6,438,057 B1 | 8/2002 | Ruckerbauer | |
| 6,442,698 B2 | 8/2002 | Nizar | |
| 6,445,591 B1 | 9/2002 | Kwong | |
| 6,452,826 B1 | 9/2002 | Kim et al. | |
| 6,452,863 B2 | 9/2002 | Farmwald et al. | |
| 6,453,400 B1 | 9/2002 | Maesako et al. | |
| 6,453,402 B1 | 9/2002 | Jeddeloh | 711/167 |
| 6,453,434 B2 | 9/2002 | Delp et al. | |
| 6,455,348 B1 | 9/2002 | Yamaguchi | |
| 6,457,095 B1 | 9/2002 | Volk | |
| 6,459,651 B1 | 10/2002 | Lee et al. | |
| 6,473,831 B1 | 10/2002 | Schade | |
| 6,480,929 B1 | 11/2002 | Gauthier et al. | |
| 6,487,102 B1 | 11/2002 | Halbert et al. | |
| 6,489,669 B2 | 12/2002 | Shimada et al. | |
| 6,490,161 B1 | 12/2002 | Johnson | |
| 6,492,726 B1 | 12/2002 | Quek et al. | |
| 6,493,789 B2 | 12/2002 | Ware et al. | |
| 6,496,440 B2 | 12/2002 | Manning | |
| 6,496,897 B2 | 12/2002 | Ware et al. | |
| 6,498,766 B2 | 12/2002 | Lee et al. | 365/233 |
| 6,510,097 B2 | 1/2003 | Fukuyama | |
| 6,510,503 B2 | 1/2003 | Gillingham et al. | |
| 6,512,392 B2 | 1/2003 | Fleury et al. | |
| 6,521,984 B2 | 2/2003 | Matsuura | |
| 6,526,471 B1 | 2/2003 | Shimomura et al. | |
| 6,526,473 B1 | 2/2003 | Kim | |
| 6,526,484 B1 | 2/2003 | Stacovsky et al. | |
| 6,545,895 B1 | 4/2003 | Li et al. | |
| 6,546,446 B2 | 4/2003 | Farmwald et al. | |
| 6,553,450 B1 | 4/2003 | Dodd et al. | |
| 6,560,158 B2 | 5/2003 | Choi et al. | |
| 6,563,337 B2 | 5/2003 | Dour | |
| 6,563,759 B2 | 5/2003 | Yahata et al. | |
| 6,564,281 B2 | 5/2003 | Farmwald et al. | |
| 6,564,285 B1 | 5/2003 | Mills et al. | 711/103 |
| 6,574,150 B2 | 6/2003 | Suyama et al. | |
| 6,584,037 B2 | 6/2003 | Farmwald et al. | |
| 6,587,912 B2 | 7/2003 | Leddige et al. | |
| 6,590,822 B2 | 7/2003 | Hwang et al. | |
| 6,594,770 B1 | 7/2003 | Sato et al. | |
| 6,597,616 B2 | 7/2003 | Tsern et al. | 365/222 |
| 6,597,617 B2 | 7/2003 | Ooishi et al. | |
| 6,614,700 B2 | 9/2003 | Dietrich et al. | |
| 6,618,267 B1 | 9/2003 | Dalal et al. | |
| 6,618,791 B1 | 9/2003 | Dodd et al. | |
| 6,621,760 B1 | 9/2003 | Ahmad et al. | |
| 6,628,538 B2 | 9/2003 | Funaba et al. | |
| 6,630,729 B2 | 10/2003 | Huang | |
| 6,631,086 B1 | 10/2003 | Bill et al. | |
| 6,639,820 B1 | 10/2003 | Khandekar et al. | |
| 6,646,939 B2 | 11/2003 | Kwak | |
| 6,650,588 B2 | 11/2003 | Yamagata | 365/222 |
| 6,650,594 B1 | 11/2003 | Lee et al. | |
| 6,657,634 B1 | 12/2003 | Sinclair et al. | |
| 6,657,918 B2 | 12/2003 | Foss et al. | |
| 6,657,919 B2 | 12/2003 | Foss et al. | |

(56) References Cited

U.S. PATENT DOCUMENTS

| | | | |
|---|---|---|---|
| 6,658,016 B1 | 12/2003 | Dai et al. | |
| 6,658,530 B1 | 12/2003 | Robertson et al. | |
| 6,664,625 B2 | 12/2003 | Hiruma | |
| 6,665,224 B1 | 12/2003 | Lehmann et al. | |
| 6,665,227 B2 | 12/2003 | Fetzer | |
| 6,668,242 B1 | 12/2003 | Reynov et al. | |
| 6,674,154 B2 | 1/2004 | Minamio et al. | |
| 6,683,372 B1 | 1/2004 | Wong et al. | |
| 6,684,292 B2 | 1/2004 | Piccirillo et al. | |
| 6,690,191 B2 | 2/2004 | Wu et al. | |
| 6,697,295 B2 | 2/2004 | Farmwald et al. | |
| 6,701,446 B2 | 3/2004 | Tsern et al. | |
| 6,705,877 B1 | 3/2004 | Li et al. | |
| 6,708,144 B1 | 3/2004 | Merryman et al. | |
| 6,710,430 B2 | 3/2004 | Minamio et al. | |
| 6,713,856 B2 | 3/2004 | Tsai et al. | |
| 6,714,433 B2 | 3/2004 | Doblar et al. | |
| 6,714,891 B2 | 3/2004 | Dendinger | |
| 6,724,684 B2 | 4/2004 | Kim | |
| 6,730,540 B2 | 5/2004 | Siniaguine | |
| 6,731,009 B1 | 5/2004 | Jones et al. | |
| 6,731,527 B2 | 5/2004 | Brown | 365/63 |
| 6,742,098 B1 | 5/2004 | Halbert et al. | |
| 6,744,687 B2 | 6/2004 | Koo et al. | |
| 6,747,887 B2 | 6/2004 | Halbert et al. | |
| 6,751,113 B2 | 6/2004 | Bhakta et al. | |
| 6,751,696 B2 | 6/2004 | Farmwald et al. | |
| 6,754,129 B2 | 6/2004 | Khatri et al. | |
| 6,754,132 B2 | 6/2004 | Kyung | |
| 6,757,751 B1 | 6/2004 | Gene | |
| 6,762,948 B2 | 7/2004 | Kyun et al. | |
| 6,765,812 B2 | 7/2004 | Anderson | |
| 6,766,469 B2 | 7/2004 | Larson et al. | |
| 6,771,526 B2 | 8/2004 | LaBerge | |
| 6,772,359 B2 | 8/2004 | Kwak et al. | |
| 6,779,097 B2 | 8/2004 | Gillingham et al. | |
| 6,785,767 B2 | 8/2004 | Coulson | |
| 6,791,877 B2 | 9/2004 | Miura et al. | |
| 6,795,899 B2 | 9/2004 | Dodd et al. | |
| 6,799,241 B2 | 9/2004 | Kahn et al. | |
| 6,801,989 B2 | 10/2004 | Johnson et al. | 711/167 |
| 6,807,598 B2 | 10/2004 | Farmwald et al. | |
| 6,807,650 B2 | 10/2004 | Lamb et al. | |
| 6,807,655 B1 | 10/2004 | Rehani et al. | |
| 6,810,475 B1 | 10/2004 | Tardieux | |
| 6,816,991 B2 | 11/2004 | Sanghani | |
| 6,819,602 B2 | 11/2004 | Seo et al. | |
| 6,819,617 B2 | 11/2004 | Hwang et al. | |
| 6,820,163 B1 | 11/2004 | McCall et al. | |
| 6,820,169 B2 | 11/2004 | Wilcox et al. | |
| 6,826,104 B2 | 11/2004 | Kawaguchi et al. | |
| 6,839,290 B2 | 1/2005 | Ahmad et al. | |
| 6,844,754 B2 | 1/2005 | Yamagata | |
| 6,845,027 B2 | 1/2005 | Mayer et al. | |
| 6,845,055 B1 | 1/2005 | Koga et al. | |
| 6,847,582 B2 | 1/2005 | Pan | |
| 6,850,449 B2 | 2/2005 | Takahashi | |
| 6,854,043 B2 | 2/2005 | Hargis et al. | |
| 6,862,202 B2 | 3/2005 | Schaefer | |
| 6,862,249 B2 | 3/2005 | Kyung | |
| 6,862,653 B1 | 3/2005 | Dodd et al. | |
| 6,873,534 B2 | 3/2005 | Bhakta et al. | |
| 6,878,570 B2 | 4/2005 | Lyu et al. | |
| 6,894,933 B2 | 5/2005 | Kuzmenka et al. | |
| 6,898,683 B2 | 5/2005 | Nakamura | |
| 6,906,407 B2 | 6/2005 | Byers et al. | |
| 6,908,314 B2 | 6/2005 | Brown | |
| 6,912,778 B2 | 7/2005 | Ahn et al. | |
| 6,914,786 B1 | 7/2005 | Paulsen et al. | |
| 6,917,219 B2 | 7/2005 | New | 326/41 |
| 6,922,371 B2 | 7/2005 | Takahashi et al. | |
| 6,930,900 B2 | 8/2005 | Bhakta et al. | |
| 6,930,903 B2 | 8/2005 | Bhakta et al. | |
| 6,938,119 B2 | 8/2005 | Kohn et al. | |
| 6,943,450 B2 | 9/2005 | Fee et al. | |
| 6,944,748 B2 | 9/2005 | Sanches et al. | |
| 6,947,341 B2 | 9/2005 | Stubbs et al. | |
| 6,951,982 B2 | 10/2005 | Chye et al. | |
| 6,952,794 B2 | 10/2005 | Lu | |
| 6,961,281 B2 | 11/2005 | Wong et al. | |
| 6,968,416 B2 | 11/2005 | Moy | |
| 6,968,419 B1 | 11/2005 | Holman | |
| 6,970,968 B1 | 11/2005 | Holman | |
| 6,980,021 B1 | 12/2005 | Srivastava et al. | 326/30 |
| 6,986,118 B2 | 1/2006 | Dickman | |
| 6,992,501 B2 | 1/2006 | Rapport | |
| 6,992,950 B2 | 1/2006 | Foss et al. | |
| 7,000,062 B2 | 2/2006 | Perego et al. | |
| 7,003,618 B2 | 2/2006 | Perego et al. | |
| 7,003,639 B2 | 2/2006 | Tsern et al. | |
| 7,007,095 B2 | 2/2006 | Chen et al. | |
| 7,007,175 B2 | 2/2006 | Chang et al. | |
| 7,010,642 B2 | 3/2006 | Perego et al. | |
| 7,010,736 B1 | 3/2006 | Teh et al. | |
| 7,024,518 B2 | 4/2006 | Halbert et al. | 711/115 |
| 7,026,708 B2 | 4/2006 | Cady et al. | |
| 7,028,215 B2 | 4/2006 | Depew et al. | |
| 7,028,234 B2 | 4/2006 | Huckaby et al. | |
| 7,033,861 B1 | 4/2006 | Partridge et al. | |
| 7,035,150 B2 | 4/2006 | Streif et al. | |
| 7,043,599 B1 | 5/2006 | Ware et al. | 711/106 |
| 7,043,611 B2 | 5/2006 | McClannahan et al. | |
| 7,045,396 B2 | 5/2006 | Crowley et al. | |
| 7,045,901 B2 | 5/2006 | Lin et al. | |
| 7,046,538 B2 | 5/2006 | Kinsley et al. | |
| 7,053,470 B1 | 5/2006 | Sellers et al. | |
| 7,053,478 B2 | 5/2006 | Roper et al. | |
| 7,058,776 B2 | 6/2006 | Lee | 711/167 |
| 7,058,863 B2 | 6/2006 | Kouchi et al. | |
| 7,061,784 B2 | 6/2006 | Jakobs et al. | |
| 7,061,823 B2 | 6/2006 | Faue et al. | |
| 7,066,741 B2 | 6/2006 | Burns et al. | |
| 7,075,175 B2 | 7/2006 | Kazi et al. | |
| 7,079,396 B2 | 7/2006 | Gates et al. | |
| 7,079,441 B1 | 7/2006 | Partsch et al. | |
| 7,079,446 B2 | 7/2006 | Murtagh et al. | |
| 7,085,152 B2 | 8/2006 | Ellis et al. | 365/149 |
| 7,085,941 B2 | 8/2006 | Li | |
| 7,089,438 B2 | 8/2006 | Raad | |
| 7,093,101 B2 | 8/2006 | Aasheim et al. | |
| 7,103,730 B2 | 9/2006 | Saxena et al. | |
| 7,110,322 B2 | 9/2006 | Farmwald et al. | |
| 7,111,143 B2 | 9/2006 | Walker | |
| 7,117,309 B2 | 10/2006 | Bearden | |
| 7,119,428 B2 | 10/2006 | Tanie et al. | |
| 7,120,727 B2 | 10/2006 | Lee et al. | 711/5 |
| 7,126,399 B1 | 10/2006 | Lee | |
| 7,127,567 B2 | 10/2006 | Ramakrishnan et al. | |
| 7,133,960 B1 | 11/2006 | Thompson et al. | 711/5 |
| 7,136,978 B2 | 11/2006 | Miura et al. | |
| 7,138,823 B2 | 11/2006 | Janzen et al. | |
| 7,149,145 B2 | 12/2006 | Kim et al. | 365/233 |
| 7,149,824 B2 | 12/2006 | Johnson | |
| 7,173,863 B2 | 2/2007 | Conley et al. | |
| 7,200,021 B2 | 4/2007 | Raghuram | 365/51 |
| 7,205,789 B1 | 4/2007 | Karabatsos | |
| 7,210,059 B2 | 4/2007 | Jeddeloh | |
| 7,215,561 B2 | 5/2007 | Park et al. | |
| 7,218,566 B1 | 5/2007 | Totolos, Jr. et al. | |
| 7,224,595 B2 | 5/2007 | Dreps et al. | 365/63 |
| 7,228,264 B2 | 6/2007 | Barrenscheen et al. | |
| 7,231,562 B2 | 6/2007 | Ohlhoff et al. | |
| 7,233,541 B2 | 6/2007 | Yamamoto et al. | 365/230.03 |
| 7,234,081 B2 | 6/2007 | Nguyen et al. | |
| 7,243,185 B2 | 7/2007 | See et al. | |
| 7,245,541 B2 | 7/2007 | Janzen | |
| 7,254,036 B2 | 8/2007 | Pauley et al. | 361/721 |
| 7,266,639 B2 | 9/2007 | Raghuram | 711/115 |
| 7,269,042 B2 | 9/2007 | Kinsley et al. | 365/52 |
| 7,269,708 B2 | 9/2007 | Ware | |
| 7,274,583 B2 | 9/2007 | Park et al. | |
| 7,286,436 B2 | 10/2007 | Bhakta et al. | 365/230 |
| 7,289,386 B2 | 10/2007 | Bhakta et al. | |
| 7,296,754 B2 | 11/2007 | Nishizawa et al. | 235/492 |

(56) References Cited

U.S. PATENT DOCUMENTS

| | | |
|---|---|---|
| 7,299,330 B2 | 11/2007 | Gillingham et al. |
| 7,302,598 B2 | 11/2007 | Suzuki et al. |
| 7,307,863 B2 | 12/2007 | Yen et al. .................. 365/63 |
| 7,317,250 B2 | 1/2008 | Koh et al. |
| 7,327,613 B2 | 2/2008 | Lee |
| 7,336,490 B2 * | 2/2008 | Harris et al. ............... 361/704 |
| 7,337,293 B2 | 2/2008 | Brittain et al. |
| 7,363,422 B2 | 4/2008 | Perego et al. .............. 711/105 |
| 7,366,947 B2 | 4/2008 | Gower et al. |
| 7,379,316 B2 | 5/2008 | Rajan |
| 7,386,656 B2 | 6/2008 | Rajan et al. |
| 7,392,338 B2 | 6/2008 | Rajan et al. |
| 7,408,393 B1 | 8/2008 | Jain et al. .................. 327/202 |
| 7,409,492 B2 | 8/2008 | Tanaka et al. .............. 711/103 |
| 7,428,644 B2 | 9/2008 | Jeddeloh et al. |
| 7,437,579 B2 | 10/2008 | Jeddeloh et al. ............ 713/300 |
| 7,441,064 B2 | 10/2008 | Gaskins |
| 7,457,122 B2 | 11/2008 | Lai et al. |
| 7,464,225 B2 | 12/2008 | Tsern ......................... 711/115 |
| 7,472,220 B2 | 12/2008 | Rajan et al. ................ 711/103 |
| 7,474,576 B2 | 1/2009 | Co et al. |
| 7,480,147 B2 | 1/2009 | Hoss et al. |
| 7,480,774 B2 | 1/2009 | Ellis et al. |
| 7,496,777 B2 | 2/2009 | Kapil .......................... 713/324 |
| 7,499,281 B2 * | 3/2009 | Harris et al. ............... 361/721 |
| 7,515,453 B2 | 4/2009 | Rajan ........................... 365/63 |
| 7,532,537 B2 | 5/2009 | Solomon et al. ............ 365/230 |
| 7,539,800 B2 | 5/2009 | Dell et al. |
| 7,573,136 B2 | 8/2009 | Jiang et al. |
| 7,580,312 B2 | 8/2009 | Rajan et al. |
| 7,581,121 B2 | 8/2009 | Barth et al. |
| 7,581,127 B2 | 8/2009 | Rajan et al. |
| 7,590,796 B2 | 9/2009 | Rajan et al. |
| 7,599,205 B2 | 10/2009 | Rajan |
| 7,606,245 B2 | 10/2009 | Ma et al. |
| 7,609,567 B2 | 10/2009 | Rajan et al. |
| 7,613,880 B2 | 11/2009 | Miura et al. |
| 7,619,912 B2 | 11/2009 | Bhakta et al. |
| 7,724,589 B2 | 5/2010 | Rajan et al. |
| 7,730,338 B2 | 6/2010 | Rajan et al. |
| 7,738,252 B2 | 6/2010 | Schuette et al. |
| 7,761,724 B2 | 7/2010 | Rajan et al. |
| 7,791,889 B2 * | 9/2010 | Belady et al. ............... 361/721 |
| 7,911,798 B2 | 3/2011 | Chang et al. |
| 7,934,070 B2 | 4/2011 | Brittain et al. |
| 7,990,797 B2 | 8/2011 | Moshayedi et al. |
| 8,116,144 B2 | 2/2012 | Shaw et al. |
| 2001/0000822 A1 | 5/2001 | Dell et al. |
| 2001/0003198 A1 | 6/2001 | Wu |
| 2001/0011322 A1 | 8/2001 | Stolt et al. |
| 2001/0019509 A1 | 9/2001 | Aho et al. |
| 2001/0021106 A1 | 9/2001 | Weber et al. |
| 2001/0021137 A1 | 9/2001 | Kai et al. |
| 2001/0046129 A1 | 11/2001 | Broglia et al. |
| 2001/0046163 A1 | 11/2001 | Yaganawa |
| 2001/0052062 A1 | 12/2001 | Lipovski |
| 2002/0004897 A1 | 1/2002 | Kao et al. |
| 2002/0015340 A1 | 2/2002 | Batinovich |
| 2002/0019961 A1 | 2/2002 | Blodgett |
| 2002/0034068 A1 | 3/2002 | Weber et al. |
| 2002/0038405 A1 | 3/2002 | Leddige et al. |
| 2002/0040416 A1 | 4/2002 | Tsern et al. |
| 2002/0041507 A1 | 4/2002 | Woo et al. |
| 2002/0051398 A1 | 5/2002 | Mizugaki .................... 365/222 |
| 2002/0060945 A1 | 5/2002 | Ikeda |
| 2002/0060948 A1 | 5/2002 | Chang et al. |
| 2002/0064073 A1 | 5/2002 | Chien |
| 2002/0064083 A1 | 5/2002 | Ryu et al. |
| 2002/0089831 A1 | 7/2002 | Forthun |
| 2002/0089970 A1 | 7/2002 | Asada et al. |
| 2002/0094671 A1 | 7/2002 | Distefano et al. |
| 2002/0121650 A1 | 9/2002 | Minamio et al. |
| 2002/0121670 A1 | 9/2002 | Minamio et al. |
| 2002/0124195 A1 | 9/2002 | Nizar |
| 2002/0129204 A1 | 9/2002 | Leighnor et al. |
| 2002/0145900 A1 | 10/2002 | Schaefer |
| 2002/0165706 A1 | 11/2002 | Raynham ..................... 703/25 |
| 2002/0167092 A1 | 11/2002 | Fee et al. |
| 2002/0172024 A1 | 11/2002 | Hui et al. |
| 2002/0174274 A1 | 11/2002 | Wu et al. |
| 2002/0184438 A1 | 12/2002 | Usui |
| 2003/0002262 A1 | 1/2003 | Benisek et al. |
| 2003/0011993 A1 | 1/2003 | Summers et al. |
| 2003/0021175 A1 | 1/2003 | Tae Kwak |
| 2003/0026155 A1 | 2/2003 | Yamagata |
| 2003/0026159 A1 | 2/2003 | Frankowsky et al. |
| 2003/0035312 A1 | 2/2003 | Halbert et al. |
| 2003/0039158 A1 | 2/2003 | Horiguchi et al. |
| 2003/0041295 A1 | 2/2003 | Hou et al. |
| 2003/0061458 A1 | 3/2003 | Wilcox et al. |
| 2003/0061459 A1 | 3/2003 | Aboulenein et al. |
| 2003/0083855 A1 | 5/2003 | Fukuyama |
| 2003/0088743 A1 | 5/2003 | Rader |
| 2003/0093614 A1 | 5/2003 | Kohn et al. |
| 2003/0101392 A1 | 5/2003 | Lee |
| 2003/0105932 A1 | 6/2003 | David et al. |
| 2003/0110339 A1 | 6/2003 | Calvignac et al. |
| 2003/0117875 A1 | 6/2003 | Lee et al. |
| 2003/0123389 A1 | 7/2003 | Russell et al. |
| 2003/0126338 A1 | 7/2003 | Dodd et al. |
| 2003/0127737 A1 | 7/2003 | Takahashi |
| 2003/0131160 A1 | 7/2003 | Hampel et al. |
| 2003/0145163 A1 | 7/2003 | Seo et al. ..................... 711/106 |
| 2003/0158995 A1 | 8/2003 | Lee et al. |
| 2003/0164539 A1 | 9/2003 | Yau |
| 2003/0164543 A1 | 9/2003 | Kheng Lee |
| 2003/0174569 A1 | 9/2003 | Amidi |
| 2003/0182513 A1 | 9/2003 | Dodd et al. |
| 2003/0183934 A1 | 10/2003 | Barrett |
| 2003/0189868 A1 | 10/2003 | Riesenman et al. |
| 2003/0189870 A1 | 10/2003 | Wilcox |
| 2003/0191888 A1 | 10/2003 | Klein |
| 2003/0191915 A1 | 10/2003 | Saxena et al. |
| 2003/0200382 A1 | 10/2003 | Wells et al. |
| 2003/0200474 A1 | 10/2003 | Li |
| 2003/0205802 A1 | 11/2003 | Segaram et al. |
| 2003/0206476 A1 | 11/2003 | Joo |
| 2003/0217303 A1 | 11/2003 | Chua-Eoan et al. |
| 2003/0223290 A1 | 12/2003 | Park et al. .................... 365/200 |
| 2003/0227798 A1 | 12/2003 | Pax |
| 2003/0229821 A1 | 12/2003 | Ma |
| 2003/0230801 A1 | 12/2003 | Jiang et al. |
| 2003/0231540 A1 | 12/2003 | Lazar et al. |
| 2003/0231542 A1 | 12/2003 | Zaharinova-Papazova et al. |
| 2004/0016994 A1 | 1/2004 | Huang |
| 2004/0027902 A1 | 2/2004 | Ooishi et al. |
| 2004/0034732 A1 | 2/2004 | Valin et al. |
| 2004/0034755 A1 | 2/2004 | LaBerge et al. |
| 2004/0037133 A1 | 2/2004 | Park et al. .................... 365/202 |
| 2004/0042503 A1 | 3/2004 | Shaeffer et al. |
| 2004/0044808 A1 | 3/2004 | Salmon et al. |
| 2004/0047228 A1 | 3/2004 | Chen |
| 2004/0049624 A1 | 3/2004 | Salmonsen |
| 2004/0057317 A1 | 3/2004 | Schaefer |
| 2004/0064647 A1 | 4/2004 | DeWhitt et al. |
| 2004/0064767 A1 | 4/2004 | Huckaby et al. |
| 2004/0083324 A1 | 4/2004 | Rabinovitz et al. |
| 2004/0088475 A1 | 5/2004 | Streif et al. |
| 2004/0117723 A1 | 6/2004 | Foss |
| 2004/0123173 A1 | 6/2004 | Emberling et al. ............ 714/733 |
| 2004/0125635 A1 | 7/2004 | Kuzmenka |
| 2004/0133736 A1 | 7/2004 | Kyung ........................ 711/105 |
| 2004/0139359 A1 | 7/2004 | Samson et al. |
| 2004/0145963 A1 | 7/2004 | Byon |
| 2004/0151038 A1 | 8/2004 | Ruckerbauer et al. |
| 2004/0174765 A1 | 9/2004 | Seo et al. |
| 2004/0177079 A1 | 9/2004 | Gluhovsky et al. ........... 707/100 |
| 2004/0178824 A1 | 9/2004 | Pan |
| 2004/0184324 A1 | 9/2004 | Pax |
| 2004/0186956 A1 | 9/2004 | Perego et al. |
| 2004/0188704 A1 | 9/2004 | Halbert et al. |
| 2004/0195682 A1 | 10/2004 | Kimura |
| 2004/0196732 A1 | 10/2004 | Lee |
| 2004/0205433 A1 | 10/2004 | Gower et al. |

(56) References Cited

U.S. PATENT DOCUMENTS

| | | |
|---|---|---|
| 2004/0208173 A1 | 10/2004 | Di Gregorio ............ 370/360 |
| 2004/0225858 A1 | 11/2004 | Brueggen |
| 2004/0228166 A1 | 11/2004 | Braun et al. |
| 2004/0228203 A1 | 11/2004 | Koo |
| 2004/0230932 A1 | 11/2004 | Dickmann |
| 2004/0236877 A1 | 11/2004 | Burton |
| 2004/0250989 A1 | 12/2004 | Im et al. |
| 2004/0256638 A1 | 12/2004 | Perego et al. |
| 2004/0257847 A1 | 12/2004 | Matsui et al. |
| 2004/0257857 A1 | 12/2004 | Yamamoto et al. |
| 2004/0260957 A1 | 12/2004 | Jeddeloh et al. |
| 2004/0264255 A1 | 12/2004 | Royer |
| 2004/0268161 A1 | 12/2004 | Ross |
| 2005/0018495 A1 | 1/2005 | Bhakta et al. |
| 2005/0021874 A1 | 1/2005 | Georgiou et al. |
| 2005/0024963 A1 | 2/2005 | Jakobs et al. |
| 2005/0027928 A1 | 2/2005 | Avraham et al. ............ 711/103 |
| 2005/0028038 A1 | 2/2005 | Pomaranski et al. |
| 2005/0036350 A1 | 2/2005 | So et al. |
| 2005/0041504 A1 | 2/2005 | Perego et al. |
| 2005/0044302 A1 | 2/2005 | Pauley et al. |
| 2005/0044303 A1 | 2/2005 | Perego et al. |
| 2005/0044305 A1 | 2/2005 | Jakobs et al. |
| 2005/0047192 A1 | 3/2005 | Matsui et al. |
| 2005/0071543 A1 | 3/2005 | Ellis et al. |
| 2005/0078532 A1 | 4/2005 | Ruckerbauer et al. |
| 2005/0081085 A1 | 4/2005 | Ellis et al. |
| 2005/0086548 A1 | 4/2005 | Haid et al. |
| 2005/0099834 A1 | 5/2005 | Funaba et al. |
| 2005/0102590 A1 | 5/2005 | Norris et al. |
| 2005/0105318 A1 | 5/2005 | Funaba et al. |
| 2005/0108460 A1 | 5/2005 | David |
| 2005/0127531 A1 | 6/2005 | Tay et al. |
| 2005/0132158 A1 | 6/2005 | Hampel et al. ............ 711/167 |
| 2005/0135176 A1 | 6/2005 | Ramakrishnan et al. |
| 2005/0138267 A1 | 6/2005 | Bains et al. |
| 2005/0138304 A1 | 6/2005 | Ramakrishnan et al. |
| 2005/0139977 A1 | 6/2005 | Nishio et al. |
| 2005/0141199 A1 | 6/2005 | Chiou et al. |
| 2005/0149662 A1 | 7/2005 | Perego et al. |
| 2005/0152212 A1 | 7/2005 | Yang et al. |
| 2005/0156934 A1 | 7/2005 | Perego et al. |
| 2005/0166026 A1 | 7/2005 | Ware et al. |
| 2005/0193163 A1 | 9/2005 | Perego et al. |
| 2005/0193183 A1 | 9/2005 | Barth et al. |
| 2005/0194676 A1 | 9/2005 | Fukuda et al. |
| 2005/0194991 A1 | 9/2005 | Dour et al. |
| 2005/0195629 A1 | 9/2005 | Leddige et al. |
| 2005/0201063 A1 | 9/2005 | Lee et al. |
| 2005/0204111 A1 | 9/2005 | Natarajan |
| 2005/0207255 A1 | 9/2005 | Perego et al. |
| 2005/0210196 A1 | 9/2005 | Perego et al. |
| 2005/0223179 A1 | 10/2005 | Perego et al. |
| 2005/0224948 A1 | 10/2005 | Lee et al. |
| 2005/0232049 A1 | 10/2005 | Park |
| 2005/0235119 A1 | 10/2005 | Sechrest et al. |
| 2005/0235131 A1 | 10/2005 | Ware |
| 2005/0237838 A1 | 10/2005 | Kwak et al. ............ 365/222 |
| 2005/0243635 A1 | 11/2005 | Schaefer ............ 365/227 |
| 2005/0246558 A1 | 11/2005 | Ku |
| 2005/0249011 A1 | 11/2005 | Maeda |
| 2005/0259504 A1 | 11/2005 | Murtugh et al. |
| 2005/0263312 A1 | 12/2005 | Bolken et al. |
| 2005/0265506 A1 | 12/2005 | Foss et al. |
| 2005/0269715 A1 | 12/2005 | Yoo |
| 2005/0278474 A1 | 12/2005 | Perersen et al. |
| 2005/0281096 A1 | 12/2005 | Bhakta et al. |
| 2005/0281123 A1 | 12/2005 | Bell et al. |
| 2005/0283572 A1 | 12/2005 | Ishihara |
| 2005/0285174 A1 | 12/2005 | Saito et al. |
| 2005/0286334 A1 | 12/2005 | Saito et al. |
| 2005/0289292 A1 | 12/2005 | Morrow et al. |
| 2005/0289317 A1 | 12/2005 | Liou et al. ............ 711/170 |
| 2006/0002201 A1 | 1/2006 | Janzen ............ 365/191 |
| 2006/0010339 A1 | 1/2006 | Klein |
| 2006/0026484 A1 | 2/2006 | Hollums ............ 714/746 |
| 2006/0038597 A1 | 2/2006 | Becker et al. |
| 2006/0039204 A1 | 2/2006 | Cornelius |
| 2006/0039205 A1 | 2/2006 | Cornelius |
| 2006/0041711 A1 | 2/2006 | Miura et al. |
| 2006/0041730 A1 | 2/2006 | Larson |
| 2006/0044909 A1 | 3/2006 | Kinsley et al. ............ 365/222 |
| 2006/0044913 A1 | 3/2006 | Klein et al. |
| 2006/0049502 A1 | 3/2006 | Goodwin et al. |
| 2006/0050574 A1 | 3/2006 | Streif et al. |
| 2006/0056244 A1 | 3/2006 | Ware ............ 365/194 |
| 2006/0062047 A1 | 3/2006 | Bhakta et al. |
| 2006/0067141 A1 | 3/2006 | Perego et al. |
| 2006/0085616 A1 | 4/2006 | Zeighami et al. |
| 2006/0087900 A1 | 4/2006 | Bucksch et al. |
| 2006/0090031 A1 | 4/2006 | Kirshenbaum et al. |
| 2006/0090054 A1 | 4/2006 | Choi et al. |
| 2006/0106951 A1 | 5/2006 | Bains ............ 710/5 |
| 2006/0112214 A1 | 5/2006 | Yeh |
| 2006/0112219 A1 | 5/2006 | Chawla et al. |
| 2006/0117152 A1 | 6/2006 | Amidi et al. ............ 711/154 |
| 2006/0117160 A1 | 6/2006 | Jackson et al. |
| 2006/0118933 A1 | 6/2006 | Haba |
| 2006/0120193 A1 | 6/2006 | Casper |
| 2006/0123265 A1 | 6/2006 | Ruckerbauer et al. |
| 2006/0126369 A1 | 6/2006 | Raghuram |
| 2006/0129712 A1 | 6/2006 | Raghuram |
| 2006/0129740 A1 | 6/2006 | Ruckerbauer et al. |
| 2006/0129755 A1 | 6/2006 | Raghuram |
| 2006/0133173 A1 | 6/2006 | Jain et al. |
| 2006/0136791 A1 | 6/2006 | Nierle |
| 2006/0149857 A1 | 7/2006 | Holman |
| 2006/0149982 A1 | 7/2006 | Vogt |
| 2006/0174082 A1 | 8/2006 | Bellows et al. |
| 2006/0176744 A1 | 8/2006 | Stave |
| 2006/0179262 A1 | 8/2006 | Brittain et al. |
| 2006/0179333 A1 | 8/2006 | Brittain et al. |
| 2006/0179334 A1 | 8/2006 | Brittain et al. |
| 2006/0180926 A1 | 8/2006 | Mullen et al. |
| 2006/0181953 A1 | 8/2006 | Rotenbert et al. ....... 365/230.06 |
| 2006/0195631 A1 | 8/2006 | Rajamani |
| 2006/0198178 A1 | 9/2006 | Kinsley et al. |
| 2006/0203590 A1 | 9/2006 | Mori et al. |
| 2006/0206738 A1 | 9/2006 | Jeddeloh et al. |
| 2006/0233012 A1 | 10/2006 | Sekiguchi et al. |
| 2006/0236165 A1 | 10/2006 | Cepulis et al. |
| 2006/0236201 A1 | 10/2006 | Gower et al. |
| 2006/0248261 A1 | 11/2006 | Jacob et al. |
| 2006/0248387 A1 | 11/2006 | Nicholson et al. |
| 2006/0262586 A1 | 11/2006 | Solomon et al. |
| 2006/0277355 A1 | 12/2006 | Ellsberry et al. |
| 2006/0294295 A1 | 12/2006 | Fukuzo |
| 2007/0005998 A1 | 1/2007 | Jain et al. |
| 2007/0050530 A1 | 3/2007 | Rajan ............ 711/5 |
| 2007/0058471 A1 | 3/2007 | Rajan et al. ............ 365/222 |
| 2007/0070669 A1 | 3/2007 | Tsern |
| 2007/0088995 A1 | 4/2007 | Tsern et al. |
| 2007/0091696 A1 | 4/2007 | Niggemeier et al. |
| 2007/0106860 A1 | 5/2007 | Foster, Sr. et al. ............ 711/170 |
| 2007/0136537 A1 | 6/2007 | Doblar et al. |
| 2007/0152313 A1* | 7/2007 | Periaman et al. ............ 257/686 |
| 2007/0162700 A1 | 7/2007 | Fortin et al. |
| 2007/0188997 A1 | 8/2007 | Hockanson et al. |
| 2007/0192563 A1 | 8/2007 | Rajan et al. ............ 711/202 |
| 2007/0195613 A1 | 8/2007 | Rajan et al. ............ 365/189.05 |
| 2007/0204075 A1 | 8/2007 | Rajan et al. |
| 2007/0216445 A1 | 9/2007 | Raghavan et al. ............ 326/83 |
| 2007/0247194 A1 | 10/2007 | Jain ............ 326/87 |
| 2007/0279084 A1 | 12/2007 | Oh et al. |
| 2007/0285895 A1 | 12/2007 | Gruendler et al. |
| 2007/0288683 A1 | 12/2007 | Panabaker et al. |
| 2007/0288686 A1 | 12/2007 | Arcedera et al. ............ 711/103 |
| 2007/0288687 A1 | 12/2007 | Panabaker et al. |
| 2007/0290333 A1 | 12/2007 | Saini et al. |
| 2008/0002447 A1 | 1/2008 | Gulachenski et al. |
| 2008/0010435 A1 | 1/2008 | Smith et al. |
| 2008/0025108 A1 | 1/2008 | Rajan et al. ............ 365/189.05 |
| 2008/0025122 A1 | 1/2008 | Schakel et al. ............ 366/222 |
| 2008/0025136 A1 | 1/2008 | Rajan et al. ............ 365/230.08 |

(56) References Cited

U.S. PATENT DOCUMENTS

| | | | |
|---|---|---|---|
| 2008/0025137 A1 | 1/2008 | Rajan et al. | 365/239 |
| 2008/0027697 A1 | 1/2008 | Rajan et al. | 703/14 |
| 2008/0027702 A1 | 1/2008 | Rajan et al. | 703/21 |
| 2008/0027703 A1 | 1/2008 | Rajan et al. | 703/21 |
| 2008/0028135 A1 | 1/2008 | Rajan et al. | |
| 2008/0028136 A1 | 1/2008 | Schakel et al. | 711/106 |
| 2008/0028137 A1 | 1/2008 | Schakel et al. | |
| 2008/0031030 A1 | 2/2008 | Rajan et al. | 365/63 |
| 2008/0031072 A1 | 2/2008 | Rajan et al. | 365/227 |
| 2008/0034130 A1 | 2/2008 | Perego et al. | |
| 2008/0037353 A1 | 2/2008 | Rajan et al. | 365/227 |
| 2008/0056014 A1 | 3/2008 | Rajan et al. | 365/189.03 |
| 2008/0062773 A1 | 3/2008 | Rajan et al. | 365/189.03 |
| 2008/0065820 A1 | 3/2008 | Gillingham et al. | |
| 2008/0082763 A1 | 4/2008 | Rajan et al. | 711/154 |
| 2008/0086588 A1 | 4/2008 | Danilak et al. | |
| 2008/0089034 A1 | 4/2008 | Hoss et al. | |
| 2008/0098277 A1 | 4/2008 | Hazelzet | |
| 2008/0103753 A1 | 5/2008 | Rajan et al. | |
| 2008/0104314 A1 | 5/2008 | Rajan et al. | |
| 2008/0109206 A1 | 5/2008 | Rajan et al. | |
| 2008/0109595 A1 | 5/2008 | Rajan et al. | |
| 2008/0109597 A1 | 5/2008 | Schakel et al. | |
| 2008/0109598 A1 | 5/2008 | Schakel et al. | |
| 2008/0115006 A1 | 5/2008 | Smith et al. | 713/601 |
| 2008/0120443 A1 | 5/2008 | Rajan et al. | |
| 2008/0120458 A1 | 5/2008 | Gillingham et al. | |
| 2008/0123459 A1 | 5/2008 | Rajan et al. | 365/227 |
| 2008/0126624 A1 | 5/2008 | Prete et al. | |
| 2008/0126687 A1 | 5/2008 | Rajan et al. | |
| 2008/0126688 A1 | 5/2008 | Rajan et al. | |
| 2008/0126689 A1 | 5/2008 | Rajan et al. | |
| 2008/0126690 A1 | 5/2008 | Rajan et al. | 711/105 |
| 2008/0126692 A1 | 5/2008 | Rajan et al. | |
| 2008/0130364 A1 | 6/2008 | Guterman et al. | |
| 2008/0133825 A1 | 6/2008 | Rajan et al. | |
| 2008/0155136 A1 | 6/2008 | Hishino | |
| 2008/0159027 A1 | 7/2008 | Kim | |
| 2008/0170425 A1 | 7/2008 | Rajan | |
| 2008/0215832 A1 | 9/2008 | Allen et al. | |
| 2008/0239857 A1 | 10/2008 | Rajan et al. | 365/227 |
| 2008/0239858 A1 | 10/2008 | Rajan et al. | 365/227 |
| 2008/0256282 A1 | 10/2008 | Guo et al. | |
| 2008/0282084 A1 | 11/2008 | Hatakeyama | |
| 2008/0282341 A1 | 11/2008 | Hatakeyama | |
| 2009/0024789 A1 | 1/2009 | Rajan et al. | |
| 2009/0024790 A1 | 1/2009 | Rajan et al. | |
| 2009/0049266 A1 | 2/2009 | Kuhne | |
| 2009/0063865 A1 | 3/2009 | Berenbaum et al. | |
| 2009/0063896 A1 | 3/2009 | Lastras-Montano et al. | |
| 2009/0070520 A1 | 3/2009 | Mizushima | |
| 2009/0089480 A1 | 4/2009 | Wah et al. | |
| 2009/0109613 A1 | 4/2009 | Legen et al. | |
| 2009/0180926 A1 | 7/2009 | Petruno et al. | |
| 2009/0216939 A1 | 8/2009 | Smith et al. | |
| 2009/0285031 A1 | 11/2009 | Rajan et al. | |
| 2009/0290442 A1 | 11/2009 | Rajan | |
| 2010/0005218 A1 | 1/2010 | Gower et al. | |
| 2010/0020585 A1 | 1/2010 | Rajan | |
| 2010/0257304 A1 | 10/2010 | Rajan et al. | |
| 2010/0271888 A1 | 10/2010 | Rajan | |
| 2010/0281280 A1 | 11/2010 | Rajan et al. | |
| 2011/0095783 A1 | 4/2011 | Ferolito et al. | |

FOREIGN PATENT DOCUMENTS

| | | | |
|---|---|---|---|
| DE | 102005036528 | 2/2007 | |
| EP | 0644547 | 3/1995 | |
| JP | 62121978 | 6/1987 | |
| JP | 01-171047 | 7/1989 | |
| JP | 03-29357 | 2/1991 | |
| JP | 03-276487 B2 | 12/1991 | |
| JP | 03-286234 | 12/1991 | |
| JP | 05-298192 | 11/1993 | |
| JP | 07-141870 | 6/1995 | |
| JP | 08-77097 | 3/1996 | |
| JP | 10233091 | 10/1998 | |
| JP | 11073773 | 3/1999 | |
| JP | 11-149775 | 6/1999 | |
| JP | 11224221 | 8/1999 | |
| JP | 22025255 A2 | 1/2002 | |
| JP | 3304893 B2 | 5/2002 | |
| JP | 2002288037 | 10/2002 | |
| JP | 04-327474 | 11/2004 | |
| JP | 2005062914 | 3/2005 | |
| JP | 2006236388 | 9/2006 | |
| KR | 1020040062717 | 7/2004 | |
| WO | WO95/05676 | 2/1995 | |
| WO | WO97/25674 | 7/1997 | |
| WO | WO9900734 | 1/1999 | |
| WO | WO00/45270 | 8/2000 | |
| WO | WO01/90900 | 11/2001 | |
| WO | WO01/97160 | 12/2001 | |
| WO | WO2004/044754 | 5/2004 | |
| WO | WO2004/051645 | 6/2004 | |
| WO | WO2006/072040 | 7/2006 | |
| WO | WO2007002324 | 1/2007 | G11C 29/00 |
| WO | WO2007/028109 | 3/2007 | |
| WO | WO2007/038225 | 4/2007 | |
| WO | WO2007/095080 | 8/2007 | |
| WO | WO2008063251 | 5/2008 | G11C 5/14 |

OTHER PUBLICATIONS

Non-Final Office Action from U.S. Appl. No. 13/260,650, Dated Feb. 1, 2013.
Notice of Allowance from U.S. Appl. No. 13/141,844, Dated Feb. 5, 2013.
Notice of Allowance from U.S. Appl. No. 11/762,013 Dated Feb. 22, 2011.
Notice of Allowance from U.S. Appl. No. 11/929,500 Dated Feb. 24, 2011.
Notice of Allowance from U.S. Appl. No. 11/763,365 Dated Mar. 1, 2011.
Final Office Action from U.S. Appl. No. 12/574,628 Dated Mar. 3, 2011.
Final Office Action from U.S. Appl. No. 11/929,571 Dated Mar. 3, 2011.
Notice of Allowance from U.S. Appl. No. 11/611,374 Dated Mar. 4, 2011.
Notice of Allowance from U.S. Appl. No. 11/929,483 Dated Mar. 4, 2011.
Notice of Allowance from U.S. Appl. No. 11/553,399 Dated Mar. 18, 2011.
Final Office Action from U.S. Appl. No. 12/507,682 Dated Mar. 29, 2011.
Non-Final Office Action from U.S. Appl. No. 11/929,403 Dated Mar. 31, 2011.
Office Action from U.S. Appl. No. 11/929,417 Dated Mar. 31, 2011.
Notice of Allowance from U.S. Appl. No. 12/838,896 Dated Apr. 19, 2011.
Notice of Allowance from U.S. Appl. No. 11/702,981 Dated Apr. 25, 2011.
Notice of Allowance from U.S. Appl. No. 11/929,320 Dated May 5, 2011.
Final Office Action from U.S. Appl. No. 11/939,440 Dated May 19, 2011.
Final Office Action from U.S. Appl. No. 11/855,805, Dated May 26, 2011.
Non-Final Office Action from U.S. Appl. No. 11/672,921 Dated May 27, 2011.
Notice of Allowance from U.S. Appl. No. 11/762,010 Dated Jun. 8, 2011.
Non-Final Office Action from U.S. Appl. No. 11/672,924 Dated Jun. 8, 2011.
Non-Final Office Action from U.S. Appl. No. 11/929,225 Dated Jun. 8, 2011.
Notice of Allowance from U.S. Appl. No. 11/929,500 Dated Jun. 13, 2011.

(56) References Cited

OTHER PUBLICATIONS

Notice of Allowance from U.S. Appl. No. 11/941,589 Dated Jun. 15, 2011.
Final Office Action from U.S. Appl. No. 12/057,306 Dated Jun. 15, 2011.
Final Office Action from U.S. Appl. No. 12/769,428 Dated Jun. 16, 2011.
Notice of Allowance from U.S. Appl. No. 12/203,100 Dated Jun. 17, 2011.
Notice of Allowance from U.S. Appl. No. 11/762,013 Dated Jun. 20, 2011.
Non-Final Office Action from U.S. Appl. No. 12/797,557 Dated Jun. 21, 2011.
Notice of Allowance from U.S. Appl. No. 11/929,483 Dated Jun. 23, 2011.
Non-Final Office Action from U.S. Appl. No. 11/702,960 Dated Jun. 23, 2011.
Non-Final Office Action from U.S. Appl. No. 11/929,655 Dated Jun. 24, 2011.
Notice of Allowance from U.S. Appl. No. 11/763,365 Dated Jun. 24, 2011.
Notice of Allowance from U.S. Appl. No. 11/611,374 Dated Jun. 24, 2011.
Non-Final Office Action from U.S. Appl. No. 11/828,182 Dated Jun. 27, 2011.
Non-Final Office Action from U.S. Appl. No. 11/828,181 Dated Jun. 27, 2011.
Non-Final Office Action from U.S. Appl. No. 12/378,328 Dated Jul. 15, 2011.
Final Office Action from U.S. Appl. No. 11/461,420 Dated Jul. 20, 2011.
Notice of Allowance from U.S. Appl. No. 11/461,437 Dated Jul. 25, 2011.
Notice of Allowance from U.S. Appl. No. 11/702,981 Dated Aug. 5, 2011.
Notice of Allowability from U.S. Appl. No. 11/855,826 Dated Aug. 15, 2011.
Non-Final Office Action from U.S. Appl. No. 12/574,628 Dated Sep. 20, 2011.
Non-Final Office Action from U.S. Appl. No. 11/858,518 Dated Sep. 27, 2011.
Notice of Allowance from U.S. Appl. No. 11/929,571 Dated Sep. 27, 2011.
Notice of Allowance from U.S. Appl. No. 11/929,500 Dated Sep. 27, 2011.
Notice of Allowance from U.S. Appl. No. 11/941,589 Dated Sep. 30, 2011.
Notice of Allowance from U.S. Appl. No. 12/816,756 Dated Oct. 3, 2011.
Non-Final Office Action from U.S. Appl. No. 12/508,496 Dated Oct. 11, 2011.
Non-Final Office Action from U.S. Appl. No. 11/588,739 Dated Oct. 13, 2011.
Notice of Allowance from U.S. Appl. No. 11/939,432 Dated Oct. 24, 2011.
Non-Final Office Action from U.S. Appl. No. 11/929,631 Dated Nov. 1, 2011.
Non-Final Office Action from U.S. Appl. No. 11/553,372 Dated Nov. 14, 2011.
Notice of Allowance from U.S. Appl. No. 11/515,223 Dated Nov. 29, 2011.
Notice of Allowance from U.S. Appl. No. 12/769,428 Dated Nov. 28, 2011.
Final Office Action from U.S. Appl. No. 11/939,440 Dated Dec. 12, 2011.
Notice of Allowance from U.S. Appl. No. 12/797,557 Dated Dec. 28, 2011.
Office Action, including English translation, from co-pending Japanese application No. 2008-529353, Dated Jan. 10, 2012.
Notice of Allowance from U.S. Appl. No. 12/838,896 Dated Jan. 18, 2012.
Final Office Action from U.S. Appl. No. 11/929,655 Dated Jan. 19, 2012.
Final Office Action from U.S. Appl. No. 12/378,328 Dated Feb. 3, 2012.
Final Office Action from U.S. Appl. No. 11/672,921 Dated Feb. 16, 2012.
Final Office Action from U.S. Appl. No. 11/672,924 Dated Feb. 16, 2012.
Final Office Action from U.S. Appl. No. 11/929,225 Dated Feb. 16, 2012.
International Search Report for Application No. EP12150807 Dated Feb. 16, 2012.
Final Office Action from U.S. Appl. No. 11/828,181 Dated Feb. 23, 2012.
Non-Final Office Action from U.S. Appl. No. 11/461,520 Dated Feb. 29, 2012.
Notice of Allowance from U.S. Appl. No. 12/574,628 Dated Mar. 6, 2012.
Non-Final Office Action from U.S. Appl. No. 13/276,212 Dated Mar. 15, 2012.
Non-Final Office Action from U.S. Appl. No. 13/343,612 Dated Mar. 29, 2012.
Notice of Allowance from U.S. Appl. No. 11/939,440 Dated Mar. 30, 2012.
European Search Report from co-pending European application No. 11194876.6-2212/2450798, Dated Apr. 12, 2012.
European Search Report from co-pending European application No. 11194862.6-2212/2450800, Dated Apr. 12, 2012.
Notice of Allowance from U.S. Appl. No. 11/929,636, Dated Apr. 17, 2012.
Final Office Action from U.S. Appl. No. 11/858,518, Dated Apr. 17, 2012.
European Search Report from co-pending European application No. 11194883.2-2212, Dated Apr. 27, 2012.
Non-Final Office Action from U.S. Appl. No. 11/553,372, Dated May 3, 2012.
Notice of Allowance from U.S. Appl. No. 11/929,631, Dated May 3, 2012.
Non-Final Office Action from U.S. Appl. No. 13/165,713, Dated May 22, 2012.
Non-Final Office Action from U.S. Appl. No. 12/144,396, Dated May 29, 2012.
Non-Final Office Action from U.S. Appl. No. 13/165,713, Dated May 31, 2012.
Non-Final Office Action from U.S. Appl. No. 13/280,251, Dated Jun. 12, 2012.
Final Office Action from U.S. Appl. No. 11/855,805, Dated Jun. 14, 2012.
Fang et al., W. Power Complexity Analysis of Adiabatic SRAM, 6th Int Conference On ASIC, vol. 1, Oct. 2005, pp. 334-337.
Non-Final Office Action from U.S. Appl. No. 11/551,399 Dated Jul. 7, 2009.
BIOS and Kernel Developer's Guide (BKDG) Family 10h Processor, Sep. 10, 2007, Published for Processor Family Purchasers.
Skerlj et al. "Boiler Device for Memory Modules". 2006, p. 1.
Great Britain Office Action from GB Patent Application No. GB0800734.6 Dated Mar. 1, 2010.
Non-Final Office Action from U.S. Appl. No. 11/588,739 Dated Dec. 9, 2009.
Non-Final Office Action from U.S. Appl. No. 11/929,412 Dated Jan. 14, 2010.
Non-Final Office Action from U.S. Appl. No. 12/507,682 Dated Mar. 8, 2010.
Non-Final Office Action, from U.S. Appl. No. 12/838,896 Dated Sep. 3, 2010.
U.S. Appl. No. 11/515,167, filed Sep. 1, 2006, Stackable Low-Profile Lead Frame Package, Fjelstad.
U.S. Appl. No. 11/588,739, filed Oct. 27, 2006, Active Raw Card for Electronic Memory Applications, Schmidt et al.

(56) References Cited

OTHER PUBLICATIONS

U.S. Appl. No. 11/855,805, filed Sep. 14, 2007, System, Method and Apparatus for Allowing Electrical Communication Between Integrated Circuit Package Contacts and Circuit Board Contacts, Werner et al.
U.S. Appl. No. 11/855,826, filed Sep. 14, 2007, System and Method for Providing Additional Space Between an Integrated Circuit and a Circuit Board for Positioning a Component Therebetween, Werner et al.
U.S. Appl. No. 11/858,518, filed Sep. 20, 2007, System and Method for Multi-Rank Asymmetric Memory Modules, Rajan et al.
U.S. Appl. No. 11/939,432, filed Nov. 13, 2007, System for Multi-Rank Partial Width Memory Modules, Rajan et al.
U.S. Appl. No. 11/941,589, filed Nov. 16, 2007, Optimal Channel Design for Memory Devices for Providing a High-Speed Memory Interface, Wang et al.
U.S. Appl. No. 12/057,306, filed Mar. 27, 2008, Standard Hybrid Memory Module, Roseband et al.
U.S. Appl. No. 12/144,396, filed Jun. 23, 2008, Memory Subsystem and Method, Wang et al.
U.S. Appl. No. 12/508,496, filed Jul. 23, 2009, Configurable Memory System, Rajan et al.
Office Action, including English translation, from co-pending Japanese application No. 2008-529353, Dated Jul. 31, 2012.
Final Office Action from U.S. Appl. No. 13/315,933, Dated Aug. 24, 2012.
Final Office Action from U.S. Appl. No. 13/276,212, Dated Aug. 30, 2012.
Non-Final Office Action from U.S. Appl. No. 13/367,182, Dated Aug. 31, 2012.
Notice of Allowance from U.S. Appl. No. 11/461,420, Dated Sep. 5, 2012.
Final Office Action from U.S. Appl. No. 13/280,251, Dated Sep. 12, 2012.
Non-Final Office Action from U.S. Appl. No. 11/929,225, Dated Sep. 17, 2012.
Notice of Allowance from U.S. Appl. No. 12/508,496, Dated Sep. 17, 2012.
Non-Final Office Action from U.S. Appl. No. 11/672,921, Dated Oct. 1, 2012.
Notice of Allowance from U.S. Appl. No. 12/057,306, Dated Oct. 10, 2012.
Notice Allowance from U.S. Appl. No. 12/144,396, Dated Oct. 11, 2012.
Non-Final Office Action from U.S. Appl. No. 13/411,489, Dated Oct. 17, 2012.
Non-Final Office Action from U.S. Appl. No. 13/471,283, Dated Dec. 7, 2012.
Office Action, including English translation, from co-pending Japanese application No. 2008-529353, Dated Dec. 27, 2012.
Office Action from co-pending European patent application No. EP12150798, Dated Jan. 3, 2013.
Notice of Allowance from U.S. Appl. No. 13/473,827, Dated Feb. 15, 2013.
Notice of Allowance from U.S. Appl. No. 12/378,328, Dated Feb. 27, 2013.
Non-Final Office Action from U.S. Appl. No. 13/536,093, Dated Mar. 1, 2013.
Office Action from co-pending Japanese patent application No. 2012-132119, Dated Mar. 6, 2013.
Notice of Allowance from U.S. Appl. No. 11/461,435, Dated Mar. 6, 2013.
Notice of Allowance from U.S. Appl. No. 11/515,223, Dated Mar. 18, 2013.
Notice of Allowance from U.S. Appl. No. 13/471,283, Dated Mar. 21, 2013.
Extended European Search Report for co-pending European patent application No. EP12150807.1, dated Feb. 1, 2013, mailed Mar. 22, 2013.
Notice of Allowance from U.S. Appl. No. 13/181,716, Dated Apr. 3, 2013.
English translation of Office Action from co-pending Korean patent application No. KR1020087019582, Dated Mar. 13, 2013.
Notice of Allowance from U.S. Appl. No. 13/618,246, Dated Apr. 23, 2013.
Notice of Allowance from U.S. Appl. No. 13/182,234, Dated May 1, 2013.
Final Office Action from U.S. Appl. No. 13/315,933, Dated May 3, 2013.
English Translation of Office Action from co-pending Korean patent application No. 10-2013-7004006, Dated Apr. 12, 2013.
EPO Communication for Co-pending European patent application No. EP11194862.6, dated May 5, 2013.
Non-Final Office Action from U.S. Appl. No. 13/620,793, Dated May 6, 2013.
Non-Final Office Action from U.S. Appl. No. 13/620,565, Dated May 24, 2013.
Final Office Action from U.S. Appl. No. 11/929,225, Dated May 24, 2013.
Final Office Action from U.S. Appl. No. 11/672,921, Dated May 24, 2013.
Notice of Allowance from U.S. Appl. No. 11/929,631, Dated May 28, 2013.
Notice of Allowance from U.S. Appl. No. 13/620,424, Dated May 29, 2013.
Notice of Allowance from U.S. Appl. No. 13/341,844, Dated May 30, 2013.
Non-Final Office Action from U.S. Appl. No. 13/620,199, Dated Jun. 17, 2013.
Non-Final Office Action from U.S. Appl. No. 13/620,207, Dated Jun. 20, 2013.
Non-Final Office Action from U.S. Appl. No. 11/828,182, Dated Jun. 20, 2013.
Final Office Action from U.S. Appl. No. 11/828,181, Dated Jun. 20, 2013.
Non-Final Office Action from U.S. Appl. No. 11/929,655, Dated Jun. 21, 2013.
Notice of Allowance from U.S. Appl. No. 13/597,895, Dated Jun. 25, 2013.
Non-Final Office Action from U.S. Appl. No. 13/620,645, Dated Jun. 26, 2013.
Notice of Allowance from U.S. Appl. No. 13/471,283, Dated Jun. 28, 2013.
Notice of Allowance from U.S. Appl. No. 13/181,747, Dated Jul. 9, 2013.
Notice of Allowance from U.S. Appl. No. 11/515,223, Dated Jul. 18, 2013.
Notice of Allowance from U.S. Appl. No. 13/182,234, Dated Jul. 22, 2013.
Notice of Allowance from U.S. Appl. No. 13/181,716, Dated Jul. 22, 2013.
Non-Final Office Action from U.S. Appl. No. 13/620,233, Dated Aug. 2, 2013.
Final Office Action from U.S. Appl. No. 13/367,182, Dated Aug. 8, 2013.
Notice of Allowance from U.S. Appl. No. 13/615,008, Dated Aug. 15, 2013.
Notice of Allowance from U.S. Appl. No. 13/620,425, Dated Aug. 20, 2013.
Non-Final Office Action from U.S. Appl. No. 13/620,601, Dated Aug. 23, 2013.
Non-Final Office Action from U.S. Appl. No. 12/507,683, Dated Aug. 27, 2013.
Non-Final Office Action from U.S. Appl. No. 13/315,933, Dated Aug. 27, 2013.
Final Office Action from U.S. Appl. No. 13/620,650, Dated Aug. 30, 2013.
Notice of Allowance from U.S. Appl. No. 13/620,424, Dated Sep. 11, 2013.
Non-Final Office Action from U.S. Appl. No. 13/620,291, Dated Sep. 12, 2013.

(56) References Cited

OTHER PUBLICATIONS

Notice of Allowance from U.S. Appl. No. 13/341,844, Dated Sep. 17, 2013.
Notice of Allowance from U.S. Appl. No. 13/620,412, dated Sep. 25, 2013.
Non-Final Office Action from U.S. Appl. No. 13/343,852, dated Sep. 27, 2013.
English Translation of Office Action from co-pending Korean patent application No. 10-2008-7019582, dated Sep. 16, 2013.
Notice of Allowance from U.S. Appl. No. 13/620,565, dated Sep. 27, 2013.
Non-Final Office Action from U.S. Appl. No. 13/279,068, dated Sep. 30, 2013.
Notice of Allowance from U.S. Appl. No. 13/620,207, dated Oct. 9, 2013.
Non-Final Office Action from U.S. Appl. No. 13/898,002, dated Oct. 10, 2013.
Notice of Allowance from U.S. Appl. No. 13/471,283, dated Oct. 15, 2013.
Notice of Allowance from U.S. Appl. No. 11/515,223, dated Oct. 24, 2013.
Notice of Allowance from U.S. Appl. No. 13/181,747, dated Oct. 28, 2013.
Notice of Allowance from U.S. Appl. No. 13/597,895, dated Oct. 29, 2013.
Notice of Allowance from U.S. Appl. No. 13/620,199, dated Nov. 13, 2013.
Final Office Action from U.S. Appl. No. 13/620,793, dated Nov. 13, 2013.
Notice of Allowance from U.S. Appl. No. 13/618,246, dated Nov. 14, 2013.
Notice of Allowance from U.S. Appl. No. 13/473,827, dated Nov. 20, 2013.
Notice of Allowance from U.S. Appl. No. 13/615,008, dated Dec. 3, 2013.
Notice of Allowance from U.S. Appl. No. 13/620,425, dated Dec. 11, 2013.
English Translation of Office Action from co-pending Japanese patent application No. P2012-197675, Dec. 3, 2013.
English Translation of Office Action from co-pending Japanese patent application No. P2012-197678, Dec. 3, 2013.
Great Britain Office Action from GB Patent Application No. GB0800734.6 Mailed Mar. 1, 2010.
Final Office Action from U.S. Appl. No. 11/461,420 Mailed Apr. 28, 2010.
Notice of Allowance from U.S. Appl. No. 11/553,372 Mailed Mar. 12, 2010.
Notice of Allowance from U.S. Appl. No. 11/553,399 Mailed Mar. 22, 2010.
Non-Final Office Action from U.S. Appl. No. 11/588,739 Mailed Dec. 29, 2009.
Notice of Allowance from U.S. Appl. No. 11/611,374 Mailed Apr. 5, 2010.
Non-Final Office Action from U.S. Appl. No. 11/828,181 Mailed Mar. 2, 2010.
Non-Final Office Action from U.S. Appl. No. 11/828,182 Mailed Mar. 29, 2010.
Final Office Action from U.S. Appl. No. 11/858,518 Mailed Apr. 21, 2010.
Non-Final Office Action from U.S. Appl. No. 11/929,432 Mailed Jan. 14, 2010.
Non-Final Office Action from U.S. Appl. No. 11/929,571 Mailed Mar. 3, 2010.
Non-Final Office Action from U.S. Appl. No. 11/929,631 Mailed Mar. 3, 2010.
Non-Final Office Action from U.S. Appl. No. 11/929,636 Mailed Mar. 9, 2010.
Non-Final Office Action from U.S. Appl. No. 11/929,655 Mailed Mar. 3, 2010.
Notice of Allowance from U.S. Appl. No. 11/939,432 Mailed Dec. 1, 2009.
Non-Final Office Action from U.S. Appl. No. 11/939,432 Mailed Apr. 12, 2010.
Notice of Allowance from U.S. Appl. No. 12/111,819 Mailed Mar. 10, 2010.
Non-Final Office Action from U.S. Appl. No. 12/507,682 Mailed Mar. 8, 2010.
Final Rejection From U.S. Appl. No. 11/461,437 Mailed Nov. 10, 2009.
Final Rejection from U.S. Appl. No. 11/762,010 Mailed Dec. 4, 2009.
Non-Final Rejection from U.S. Appl. No. 11/672,921 Mailed Dec. 8, 2009.
Non-Final Rejection from U.S. Appl. No. 11/672,924 Mailed Dec. 14, 2009.
Non-Final Rejection from U.S. Appl. No. 11/929,225 Mailed Dec. 14, 2009.
Non-Final Rejection from U.S. Appl. No. 11/929,261 Mailed Dec. 14, 2009.
Notice of Allowance From U.S. Appl. No. 11/611,374 Mailed Nov. 30, 2009.
Notice of Allowance From U.S. Appl. No. 12/111,819 Mailed Nov. 20, 2009.
Notice of Allowance From U.S. Appl. No. 12/111,828 Mailed Dec. 15, 2009.
German Office Action From German Patent Application No. 11 2006 002 300.4-55 Mailed Jun. 5, 2009 (With Translation).
Non-Final Office Action From U.S. Appl. No. 11/461,430 Mailed Feb. 19, 2009.
Final Office Action From U.S. Appl. No. 11/461,435 Mailed Jan. 28, 2009.
Non-Final Office Action From U.S. Appl. No. 11/461,437 Mailed Jan. 26, 2009.
Non-Final Office Action From U.S. Appl. No. 11/461,441 Mailed Apr. 2, 2009.
Non-Final Office Action From U.S. Appl. No. 11/611,374 Mailed Mar. 23, 2009.
Non-Final Office Action From U.S Appl. No. 11/762,010 Mailed Mar. 20, 2009.
Non-Final Office Action From U.S Appl. No. 11/939,432 Mailed Feb. 6, 2009.
Non-Final Office Action From U.S Appl. No. 12/111,819 Mailed Apr. 27, 2009.
Non-Final Office Action From U.S. Appl. No. 12/111,828 Mailed Apr. 17, 2009.
Non-final Office Action from U.S. Appl. No. 11/461430 mailed on Feb. 19, 2009.
Final Office Action from U.S. Appl. No. 11/461435 mailed on Jan. 28, 2009.
Non-final Office Action from U.S. Appl. No. 11/461437 mailed on Jan. 26, 2009.
Non-final Office Action from U.S. Appl. No. 11/939432 mailed on Feb. 19, 2009.
Office Action from U.S. Appl. No. 11/461,427 mailed on Sep. 5, 2008.
Final Office Action from U.S. Appl. No. 11/461,430 mailed on Sep. 8, 2008.
Notice of Allowance from U.S. Appl. No. 11/474,075 mailed on Nov. 26, 2008.
Office Action from U.S. Appl. No. 11/474,076 mailed on Nov. 3, 2008.
Office Action from U.S. Appl. No. 11/524,811 mailed on Sep. 17, 2008.
Fang et al., W. Power Complexity Analysis of Adiabatic SRAM, 6th Int. Conference on ASIC, vol. 1, Oct. 2005, pp. 334-337.
Pavan et al., P. A Complete Model of E2PROM Memory Cells for Circuit Simulations, IEEE Transactions on Computer-Aided Design of Integrated Circuits and Systems, vol. 22, No. 8, Aug. 2003, pp. 1072-1079.
German Office Action from German Patent Application No. 11 2006 001 810.8-55 Dated Feb. 18, 2009 (With Translation).
Non-Final Office Action from U.S. Appl. No. 11/461,420 Dated Jul. 23, 2009.

(56) References Cited

OTHER PUBLICATIONS

Notice of Allowance from U.S. Appl. No. 11/461,430 Dated Sep. 9, 2009.
Non-Final Office Action from U.S. Appl. No. 11/461,435 Dated Aug. 5, 2009.
Non-Final Office Action from U.S. Appl. No. 11/515,167 Dated Sep. 25, 2009.
Non-Final Office Action from U.S. Appl. No. 11/515,223 Dated Sep. 22, 2009.
Non-Final Office Action from U.S. Appl. No. 11/538,041 Dated Jun. 10, 2009.
Non-Final Office Action from U.S. Appl. No. 11/553,372 Dated Jun. 25, 2009.
Notice of Allowance from U.S. Appl. No. 11/553,372 Dated Sep. 30, 2009.
Non-Final Office Action from U.S. Appl. No. 11/553,390 Dated Sep. 9, 2009.
Non-Final Office Action from U.S. Appl. No. 11/553,399 Dated Jul. 7, 2009.
Notice of Allowance from U.S. Appl. No. 11/553,399 Dated Oct. 13, 2009.
Notice of Allowance from U.S. Appl. No. 11/611,374 Dated Sep. 15, 2009.
Non-Final Office Action from U.S. Appl. No. 11/702,960 Dated Sep. 25, 2009.
Non-Final Office Action from U.S. Appl. No. 11/702,981 Dated Aug. 19, 2009.
Non-Final Office Action from U.S. Appl. No. 11/762,013 Dated Jun. 5, 2009.
Non-Final Office Action from U.S. Appl. No. 11/763,365 Dated Oct. 28, 2009.
Non-Final Office Action from U.S. Appl. No. 11/858,518 Dated Aug. 14, 2009.
Non-Final Office Action from U.S. Appl. No. 11/929,500 Dated Oct. 13, 2009.
Notice of Allowance from U.S. Appl. No. 11/939,432 Dated Sep. 24, 2009.
Non-Final Office Action from U.S. Appl. No. 11/941,589 Dated Oct. 1, 2009.
Bios and Kernel Developer's Guide (BKDG) Family 10h Processor, Sep. 7, 2007, Published for Processor Family Purchasers.
Skerlj et al. "Buffer Device for Memory Modules". 2006, p. 1.
Kellerbauer, R. "Die Schnelle Million," with translation, "The Quick Million: Memory Expansion for 1040 ST and Mega ST 1," Dec. 1991.
Supplemental European Search Report and Search Opinion issued Sep. 21, 2009 in European Application No. 07870726.2, 8 pp.
Wu et al., "eNVy: A Non-Volatile, Main Memory Storage System", ASPLOS-VI Proceedings, Oct. 4-7, 1994, pp. 86-97.
Using Two Chip Selects to Enable Quad Rank, From IP.COM # 000132468D, Feb. 26, 2008.
Buffer Device for Memory Modules (DIMM), IP.com Prior Art Database, <URL: http://ip.com/IPCOM/000144850>, Feb. 10, 2007, 1 pg.
German Office Action from German Patent Application No. 11 2006 002 300.4-55 Dated May 11, 2009 (With Translation).
Copy of Great Britain Office Action from GB Patent Application No. GB0800734.6 Dated Mar. 1, 2010.
Great Britain Office Action from GB Patent Application No. GB0803913.3 Dated Mar. 1, 2010.
Preliminary Report on Patentability From PCT Application No. PCT/US06/24360 Dated on Jan. 10, 2008.
Written Opinion From PCT Application No. PCT/US06/24360 Dated on Jan. 8, 2007.
International Search Report From PCT Application No. PCT/US06/34390 Dated on Nov. 21, 2007.
Written Opinion From PCT Application No. PCT/US06/34390 Dated on Nov. 21, 2007.
International Preliminary Examination Report From PCT Application No. PCT/US07/016385 Dated Feb. 3, 2009.
Search Report and Written Opinion From PCT Application No. PCT/US07/03460 Dated on Feb. 14, 2008.
Final Office Action from U.S. Appl. No. 11/461,420 Dated Apr. 28, 2010.
Final Office Action from U.S. Appl. No. 11/461,435 Dated May 13, 2010.
Final Office Action from U.S. Appl. No. 11/515,167 Dated Jun. 3, 2010.
Notice of Allowance from U.S. Appl. No. 11/515,223 Dated Jul. 30, 2010.
Notice of Allowance from U.S. Appl. No. 11/553,372 Dated Mar. 12, 2010.
Notice of Allowance from U.S. Appl. No. 11/553,372 Dated Aug. 4, 2010.
Final Office Action from U.S. Appl. No. 11/553,390 Dated Jun. 24, 2010.
Notice of Allowance from U.S. Appl. No. 11/553,399 Dated Mar. 22, 2010.
Notice of Allowance from U.S. Appl. No. 11/553,399 Dated Dec. 3, 2010.
Non-Final Office Action from U.S. Appl. No. 11/588,739 Dated Dec. 29, 2009.
Notice of Allowance from U.S. Appl. No. 11/611,374 Dated Apr. 5, 2010.
Notice of Allowance from U.S. Appl. No. 11/611,374 Dated Jul. 19, 2010.
Notice of Allowance from U.S. Appl. No. 11/611,374 Dated Oct. 29, 2010.
Final Office Action from U.S. Appl. No. 11/672,921 Dated Jul. 23, 2010.
Final Office Action from U.S. Appl. No. 11/672,924 Dated Sep. 7, 2010.
Final Office Action from U.S. Appl. No. 11/702,960 Dated Jun. 21, 2010.
Non-Final Office Action from U.S. Appl. No. 11/702,981 Dated Mar. 11, 2009.
Notice of Allowance from U.S. Appl. No. 11/762,010 Dated Jul. 2, 2010.
Notice of Allowance from U.S. Appl. No. 11/762,010 Dated Oct. 22, 2010.
Notice of Allowance from U.S. Appl. No. 11/762,013 Dated Aug. 17, 2010.
Notice of Allowance from U.S. Appl. No. 11/762,013 Dated Dec. 7, 2010.
Notice of Allowance from U.S. Appl. No. 11/763,365 Dated Jun. 29, 2010.
Notice of Allowance from U.S. Appl. No. 11/763,365 Dated Oct. 20, 2010.
Non-Final Office Action from U.S. Appl. No. 11/828,181 Dated Mar. 2, 2010.
Non-Final Office Action from U.S. Appl. No. 11/828,182 Dated Mar. 29, 2010.
Non-Final Office Action from U.S. Appl. No. 11/855,805 Dated Sep. 21, 2010.
Final Office Action from U.S. Appl. No. 11/858,518 Dated Apr. 21, 2010.
Non-Final Office Action from U.S. Appl. No. 11/858,518 Dated Sep. 8, 2010.
Final Office Action from U.S. Appl. No. 11/929,225 Dated Aug. 27, 2010.
Final Office Action from U.S. Appl. No. 11/929,261 Dated Sep. 7, 2010.
Final Office Action from U.S. Appl. No. 11/929,286 Dated Aug. 20, 2010.
Notice of Allowance from U.S. Appl. No. 11/929,320 Dated Sep. 29, 2010.
Final Office Action from U.S. Appl. No. 11/929,403 Dated Aug. 31, 2010.
Final Office Action from U.S. Appl. No. 11/929,417 Dated Aug. 31, 2010.
Non-Final Office Action from U.S. Appl. No. 11/929,432 Dated Jan. 14, 2010.

(56) References Cited

OTHER PUBLICATIONS

Final Office Action from U.S. Appl. No. 11/929,432 Dated Aug. 20, 2010.
Final Office Action from U.S. Appl. No. 11/929,450 Dated Aug. 20, 2010.
Notice of Allowance from U.S. Appl. No. 11/929,483 Dated Oct. 7, 2010.
Final Office Action from U.S. Appl. No. 11/929,500 Dated Jun. 24, 2010.
Non-Final Office Action from U.S. Appl. No. 11/929,571 Dated Mar. 3, 2010.
Non-Final Office Action from U.S. Appl. No. 11/929,631 Dated Mar. 3, 2010.
Final Office Action from U.S. Appl. No. 11/929,631 Dated Nov. 18, 2010.
Non-Final Office Action from U.S. Appl. No. 11/929,636 Dated Mar. 9, 2010.
Non-Final Office Action from U.S. Appl. No. 11/929,655 Dated Mar. 3, 2010.
Final Office Action from U.S. Appl. No. 11/929,655 Dated Nov. 22, 2010.
Non-Final Office Action from U.S. Appl. No. 11/939,432 Dated Apr. 12, 2010.
Non-Final Office Action from U.S. Appl. No. 11/939,440 Dated Sep. 17, 2010.
Notice of Allowance from U.S. Appl. No. 11/941,589 Dated Oct. 25, 2010.
Non-Final Office Action from U.S. Appl. No. 12/057,306 Dated Oct. 8, 2010.
Notice of Allowance from U.S. Appl. No. 12/111,819 Dated Mar. 10, 2010.
Non-Final of Action from U.S. Appl. No. 12/507,682 Dated Mar. 8, 2010.
Non-Final Office Action from U.S. Appl. No. 12/574,628 Dated Jun. 10, 2010.
Non-Final Office Action from U.S. Appl. No. 12/769,428 Dated Nov. 8, 2010.
Non-Final Office Action from U.S. Appl. No. 12/838,896 Dated Sep. 3, 2010.

\* cited by examiner

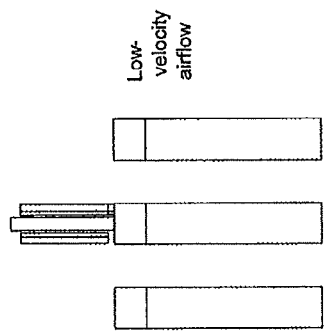
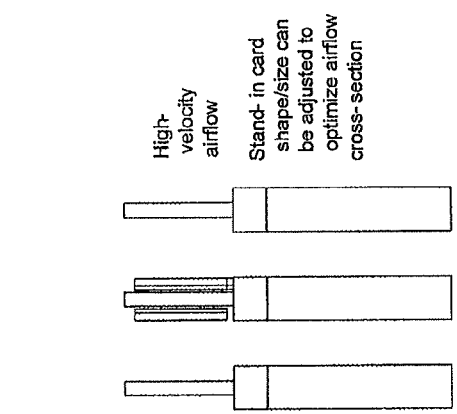
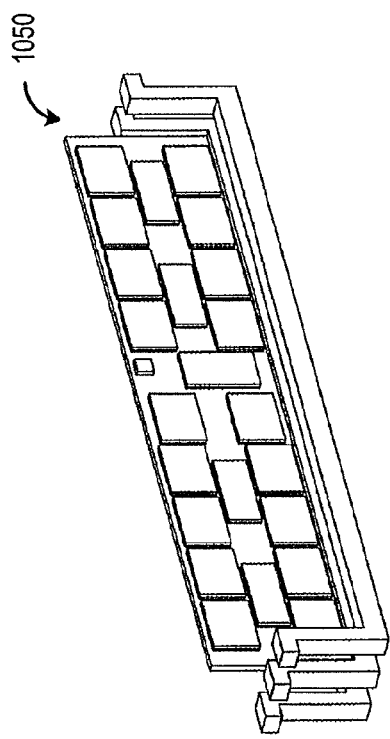
FIG. 10A
FIG. 10B
FIG. 10C
FIG. 10D

EMBOSSED HEAT SPREADER

CROSS-REFERENCE TO RELATED APPLICATIONS

This application is a divisional of and claims the benefit of priority to U.S. patent application Ser. No. 12/203,100, which was filed Sep. 2, 2008, which claimed the benefit of U.S. Provisional Patent Application Ser. No. 61/014,740, filed Dec. 18, 2007. Each of the prior applications is hereby incorporated herein by reference in its entirety.

BACKGROUND OF THE INVENTION

1. Field of the Invention

Embodiments of the present invention relate generally to electronic systems and, more specifically, to design of a heat spreader for memory modules.

2. Description of the Related Art

In modern computing platforms, there is provision for population of semiconductor memory using one or more dual inline memory modules (DIMMs). One of the problems commonly encountered during integration of memory modules into a computer system is heat dissipation. The ability to maintain the temperature of components on a module within the required operating range depends on many factors including module surface area, airflow velocity, temperature of incoming air, location of the module in the system and presence or absence of adjacent modules. Designers of electronic systems make tradeoffs between these variables to achieve acceptable system thermal performance while keeping cost to a minimum.

Early designs have employed heat sinks and custom-designed enclosures in an attempt to address the heat dissipation problem. While designs employing heat spreaders have been used in systems to date, the inexorable demand for more, higher speed, and higher density memory modules have caused memory power dissipation requirements to increase faster than improvements in heat sink/heat spreader performance. Oftentimes, some designs are capable of dissipating the heat, but fall short with respect to the mechanical integrity of the module under shipping, handling, and insertion/removal. Other designs may satisfy the mechanical integrity constraints, but fall short in the area of heat dissipation. Still other designs may achieve both the heat dissipation and mechanical requirements, but are impractically expensive.

Another major difficulty in a conventional heat spreader design is that of achieving acceptable thermal performance independent of the large changes in air flow velocity caused by the variation of spacing between modules depending on which modules are installed in the system. Thermal solutions that work well with all modules present in the system often do not perform acceptably with only a single module present, due to the reduced air velocity and tendency of the airflow to bypass around the module.

As the foregoing illustrates, what is needed in the art is a heat spreader design that overcomes these and/or other problems associated with the prior art.

SUMMARY OF THE INVENTION

One embodiment of the present invention sets forth a heat spreader for dissipating thermal heat generated by electronic components. The heat spreader is utilized as an assembly comprising a printed circuit board (PCB), electronic components disposed on the PCB, a thermal interface material (TIM) thermally coupled to the electronic components, and a heat spreader plate thermally coupled to the TIM. Furthermore, the heat spreader plate includes an embossed pattern.

Another embodiment of the present invention sets forth a heat spreader module for dissipating thermal heat generated by electronic components comprising a first PCB, the electronic components disposed on the first PCB, a TIM thermally coupled to the electronic components, and a second PCB thermally coupled to the TIM and adapted to dissipate thermal heat generated by the electronic components.

One advantage of the disclosed heat spreader is that surface area available for heat conduction between the heat spreader plate and surrounding medium may be increased relative to the prior art designs. The embossed pattern may be advantageously adjusted to achieve large surface area and at the same time enhance the rigidity of the heat spreader, allowing thinner material to be used effectively. The embossed pattern may be produced with a simple stamping operation.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 10A-10D illustrate heat spreader assemblies showing air flow dynamics, according to various embodiments of the present invention.

DETAILED DESCRIPTION

Embodiments of the present invention relate to design of a heat spreader (also commonly referred to as a "heat sink") for memory modules. They may also be applied more generally to electronic sub-assemblies that are commonly referred to as add-in cards, daughtercards, daughterboards, or blades. These are sub-components that are attached to a larger system by a set of sockets or connectors and mechanical support components collectively referred to as a motherboard, backplane, or card cage. Note that many of these terms are sometimes hyphenated in common usage, i.e. daughter-card instead of daughtercard. The common characteristic linking these different terms is that the part of the system they describe is optional, i.e. may or may not be present in the system when it is operating, and when it is present it may be attached or "populated" in different locations which are functionally identical or nearly so but result in physically different configurations with consequent different flow patterns of the cooling fluid used within the system.

Figure 1:
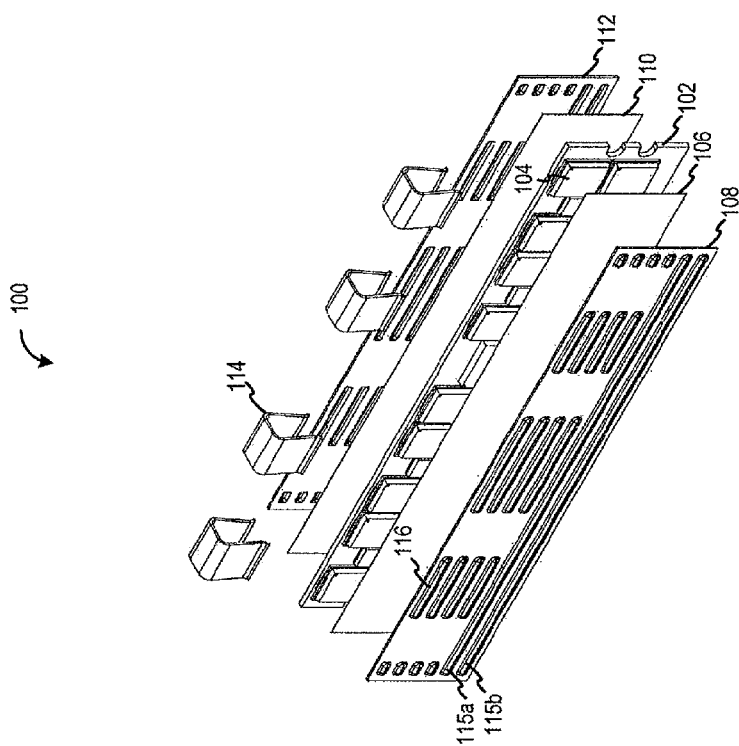
FIG. 1 illustrates an exploded view of a heat spreader module, according to one embodiment of the present invention.

FIG. 1 illustrates an exploded view of a heat spreader module 100, according to one embodiment of the present invention. As shown, the heat spreader module 100 includes a printed circuit board (PCB) 102 to which one or more electronic components 104 are mounted. As described below, in various embodiments, the electronic components 104 may be disposed on both sides or only one side of the PCB 102. As is readily understood, the operation of the electronic components produces thermal energy, and it is understood in the art that some means for dissipating the thermal energy must be considered in any physical design using electronic components.

In the embodiment shown in FIG. 1, the heat generated by the electronic components 104 is dissipated by virtue of physical contact to the electronic components 104 by one or more thermally conductive materials. As shown, the electronic components 104 are in physical contact with a layer of thermally conductive material that serves as a thermal interface material (referred to as "TIM") 106. The TIM 106 is, in turn, in contact with a heat spreader plate 108. Both the TIM 106 and the heat spreader plate 108 are thermally conductive materials, although there is no specific value of thermal conductivity coefficients or thermally conductive ratios required for the embodiments to be operable.

The TIM 106 may come in the form of a lamination layer or sheet made of any from a group of materials including conductive particle filled silicon rubber, foamed thermoset material, and a phase change polymer. Also, in some embodiments, the materials used as gap fillers may also serve as a thermal interface material. In some embodiments, the TIM 106 is applied as an encasing of the electronic components 104 and once applied the encasing may provide some rigidity to the PCB assembly when adhesively attached both to the components and the heat spreader. In an embodiment that both adds rigidity to the package and facilitates disassembly for purposes of inspection and re-work, the TIM 106 may be a thermoplastic material such as the phase change polymer or a compliant material with a non-adhesive layer such as metal foil or plastic film.

The heat spreader plate 108 can be formed from any of a variety of malleable and thermally conductive materials with a low cost stamping process. In one embodiment, the overall height of the heat spreader plate 108 may be between 2 mm and 2.5 mm. In various embodiments, the heat spreader plate 108 may be flat or embossed with a pattern that increases the rigidity of the assembly along the long axis.

Figure 4:
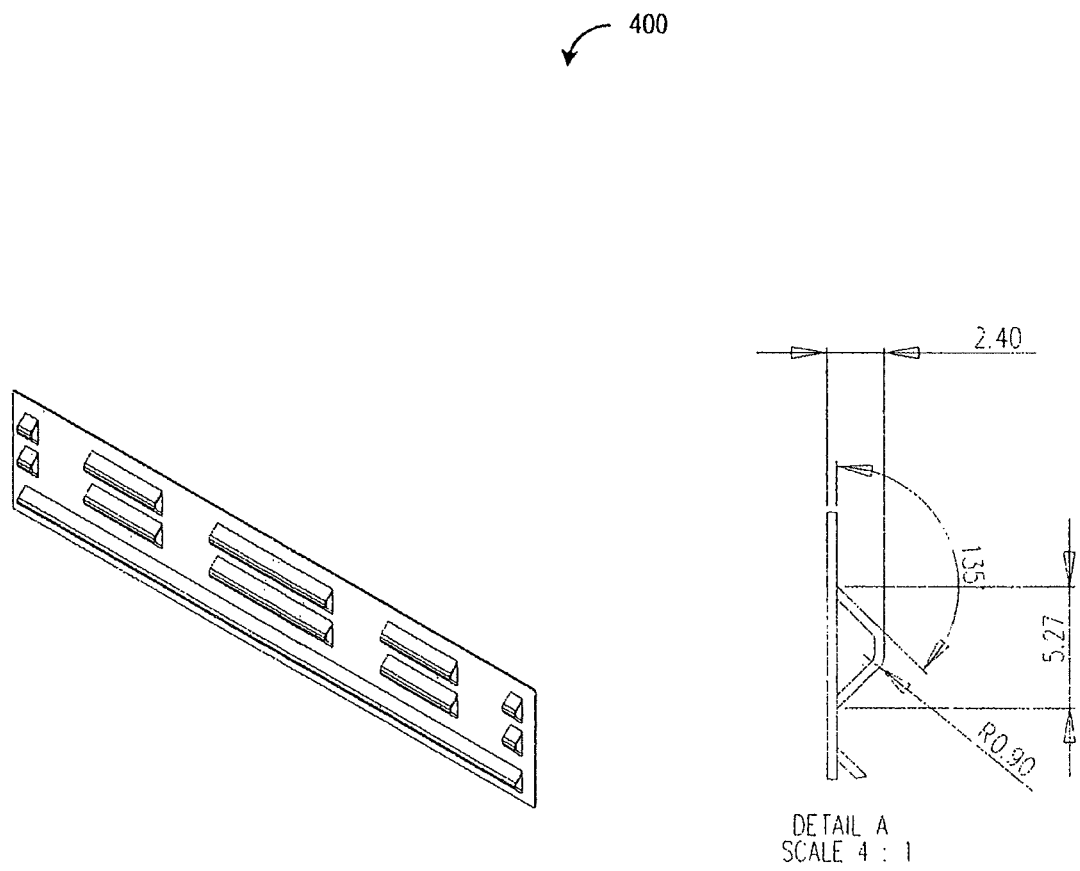
FIG. 4 illustrates a heat spreader module with open-face embossment areas, according to one embodiment of the present invention.

In one embodiment, the embossed pattern may include long embossed segments 115a, 115b that run substantially the entire length of the longitudinal edge of the heat spreader plate. In another embodiment, in particular to accommodate an assembly involving c-clips 114, the embossed pattern may include shorter segments 116. As readily envisioned, and as shown, patterns including both long and short segments are possible. These shorter segments are disposed as to provide location guidance for the retention clips. Furthermore, the ends of the segment of embossing, whether a long embossed segment or a shorter segment, may be closed (as illustrated in FIG. 1) or may be open (as illustrated in FIG. 4).

In designs involving embossed patterns with closed ends, those skilled in the art will readily recognize that the embossing itself increases the surface area available for heat conduction with the surrounding fluid (air or other gases, or in some cases liquid fluid) as compared with a non-embossed (flat) heat spreader plate. The general physical phenomenon exploited by embodiments of this invention is that thermal energy is conducted from one location to another location as a direct function of surface area. Embossing increases the surface area available for such heat conduction, thereby improving heat dissipation. For example, a stamped metal pattern may be used to increase the surface area available for heat conduction.

As a comparison, Table 1 below illustrates the difference in surface area, comparing one side of a flat heat spreader plate to one side of an embossed heat spreader plate having the embossed pattern as shown in FIG. 1.

TABLE 1

| Characteristic | Surface area (flat heat spreader) | Surface area (embossed heat spreader) | Increase in surface area (%) |
|---|---|---|---|
| Embossed | 3175 mm$^2$ | 3175(+331) mm$^2$ | 10.6% |

In some embodiments, the PCB 102 may have electrical components 104 disposed on both sides of the PCB 102. In such a case, the heat spreader module 100 may further include a second layer of TIM 110 and a second heat spreader plate 112. All of the discussions herein with regard to the TIM 106 apply with equal force to the TIM 110. Similarly, all of the discussions herein with regard to the heat spreader plate 108 apply with equal force to the heat spreader plate 112. Furthermore, the heat spreader plate(s) may be disposed such that the flat side (concave side) is toward the electrical components (or stated conversely, the convex side is away from the electrical components). In various embodiments, a heat spreader may be disposed only on one side of the PCB 102 or be disposed on both sides.

In one embodiment, the heat spreader plate 108 may include perforations or openings (not shown in FIG. 1) allowing interchange of the cooling fluid between inner and outer surfaces (where the term "inner surface" refers to the surface that is closest to the electronic components 104). These openings may be located at specific positions relative to an embossed pattern such that flow over the opening is accelerated relative to the average flow velocity. Alternately, the openings may be located at the top of narrow protrusions from the surface such that they are outside the boundary layer of slower fluid velocity immediately adjacent to the surface. In either case, the TIM 110 may be designed in coordination with the heat spreader plate 108 to ensure that the TIM 110 also allows fluid flow from beneath the heat spreader plate 108 out through the holes. This can be ensured by applying a liquid TIM to either the heat spreader plate 108 or the electronic components 104 using a printing or transfer process which only leaves the TIM 110 on the high points of the surface and does not block the holes of the heat spreader plate 108 or the spaces between the electronic components 104.

Alternately a tape or sheet TIM can be used where the TIM material itself allows passage of fluid through it, or the sheet may be perforated such that there are sufficient open passages to ensure there is always an open path for the fluid through the TIM 110 and then the heat spreader plate 108.

In another embodiment, the heat spreader plate 108 may be formed as a unit from sheet or roll material using cutting (shearing/punching) and deformation (embossing/stamping/bending) operations and achieves increased surface area and/or stiffness by the formation of fins or ridges protruding out of the original plane of the material, and/or slots cut into the material (not shown in FIG. 1). The fins may be formed by punching a "U" shaped opening and bending the resulting tab inside the U to protrude from the plane of the original surface around the cut. The formation of the U shaped cut and bending of the resulting tab may be completed as a single operation for maximum economy. The protruding tab may be modified to a non-planar configuration: for example an edge may be folded over (hemmed), the entire tab may be twisted, the free edge opposite the bend line may be bent to a curve, a corner may be bent at an angle, etc.

In another embodiment, the heat spreader plate 108 may be manufactured by any means which incorporates fins or ridges protruding into the surrounding medium or slots cut into the heat spreader (not shown in FIG. 1), where the fins or slots are designed with a curved shape (i.e. an airfoil) or placed at an angle to the incoming fluid so as to impart a velocity component to the impinging fluid that is in a plane parallel or nearly parallel to the base of the heat spreader (contact surface with the TIM or electronic components) and at right angles to the original fluid flow direction. The sum of this velocity component with the original linear fluid velocity vector creates a helical flow configuration in the fluid flowing over the heat spreader which increases the velocity of the fluid immediately adjacent to the heat spreader and consequently reduces the effective thermal resistance from the heat spreader to the fluid. Heat spreaders which are designed to create helical flow are referred to herein as "angled fin heat spreaders," and the fins positioned at an angle to the original fluid flow direction are referred to herein as "angled fins", without regard to the exact angle or shape of the fins which is used to achieve the desired result. The angled fins may be continuous or appear as segments of any length, and may be grouped together in stripes aligned with the expected air flow or combined with other bent, cut, or embossed features.

In another embodiment, two or more memory modules incorporating angled fin heat spreader plates are placed next to each other with the cooling fluid allowed to flow in the gaps between modules. When angled fin heat spreaders with matching angles (or an least angles in the same quadrant i.e. 0-90, 90-180, etc.) are used on both faces of each module and consequently both sides of a gap, the fins on both heat spreaders contribute to starting the helical flow in the same direction and the angled fins remain substantially parallel to the local flow at the surface of each heat spreader plate down the full length of the module.

An additional benefit which may be achieved with the angled fins is insensitivity to the direction of air flow-cooling air for the modules is commonly supplied in one of three configurations. The first configuration is end-to-end (parallel to the connector). The second configuration is bottom-to-top (through holes in the backplane or motherboard). The third configuration is in both ends and out the bottom or top. The reverse flow direction for any of these configurations may also occur. If the fin angle is near 45 degrees relative to the edges of the module, any of the three cases will give similar cooling performance and take advantage of the full fin area.

Typical heat spreader fins designed according to the present art are arranged parallel to the expected air flow for a single configuration and will have much worse performance when the air flow is at 90 degrees to the fins, as it would always be for at least one of the three module airflow cases listed above. The angle of the fins does not have to be any particular value for the benefit to occur, although angles close to 45 degrees will have the most similar performance across all different airflow configurations. Smaller or larger angles will improve the performance of one flow configuration at the expense of the others, but the worst case configuration will always be improved relative to the same case without angled fins. Given this flexibility it may be possible to use a single heat spreader design for systems with widely varying airflow patterns, where previously multiple unique heat spreader designs would have been required.

In yet another embodiment, the heat spreader plate 108 may be manufactured by any means which includes a mating surface at the edge of the module opposite the connector (element 1108 in FIG. 11A) to allow for heat conduction to an external heat sink or metal structure such as the system chassis. The mating surface will typically be a flat bent tab and/or machined edge designed to lie within a plane parallel to the motherboard or backplane and perpendicular to the module PCB and heat spreader seating plane. Other mating surface features which facilitate good thermal conduction are possible, such as repeating parallel grooves, flexible metal "fingers" to bridge gaps, etc. Thermal interface material or coatings may be applied to the module to improve conductivity through the surface. The heat spreader plate 108 may include alignment features (not shown in FIG. 1) to ensure that the mating surfaces of the heat spreader plates on both sides of a module lie within the same plane to within an acceptable tolerance. These alignment features may include tabs or pins designed to contact one or more edges or holes of the PCB 102, or tabs or pins which directly contact the heat spreader plate 108 on the other face of the module.

In another embodiment, the heat spreader plate 108 may be applied to the electronic components 104 (especially DRAM) in the form of a flexible tape or sticker (i.e. the heat spreader has negligible resistance to lengthwise compressive forces). TIM 110 may be previously applied to the electronic components 104 or more commonly provided as a backing material on the tape or sticker. In this embodiment the heat spreader plate 108 is flexible enough to conform to the relative heights of different components and to the thermal expansion and contraction of the PCB 102. The heat spreader plate 108 may be embossed, perforated, include bent tabs, etc., to enhance surface area, allow air passage from inner to outer surfaces, and reduce thermal resistance in conducting heat to the fluid.

Figure 2:
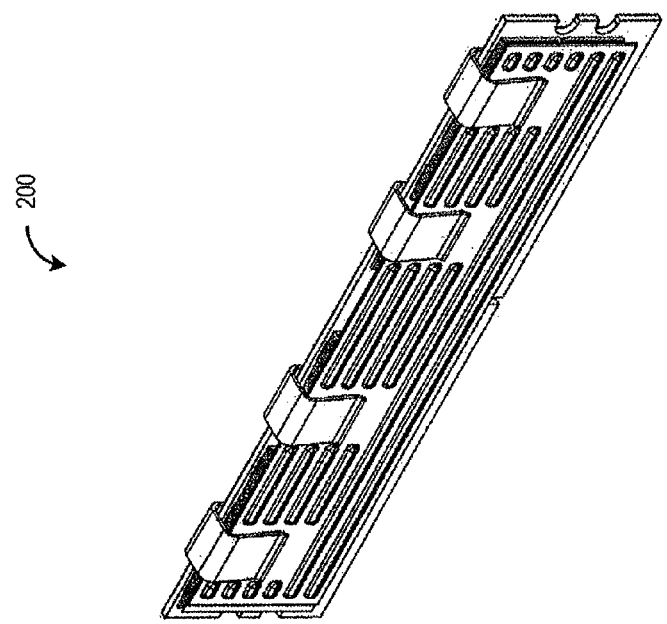
FIG. 2 illustrates an assembled view of a heat spreader module, according to one embodiment of the present invention.
Figure 3A:
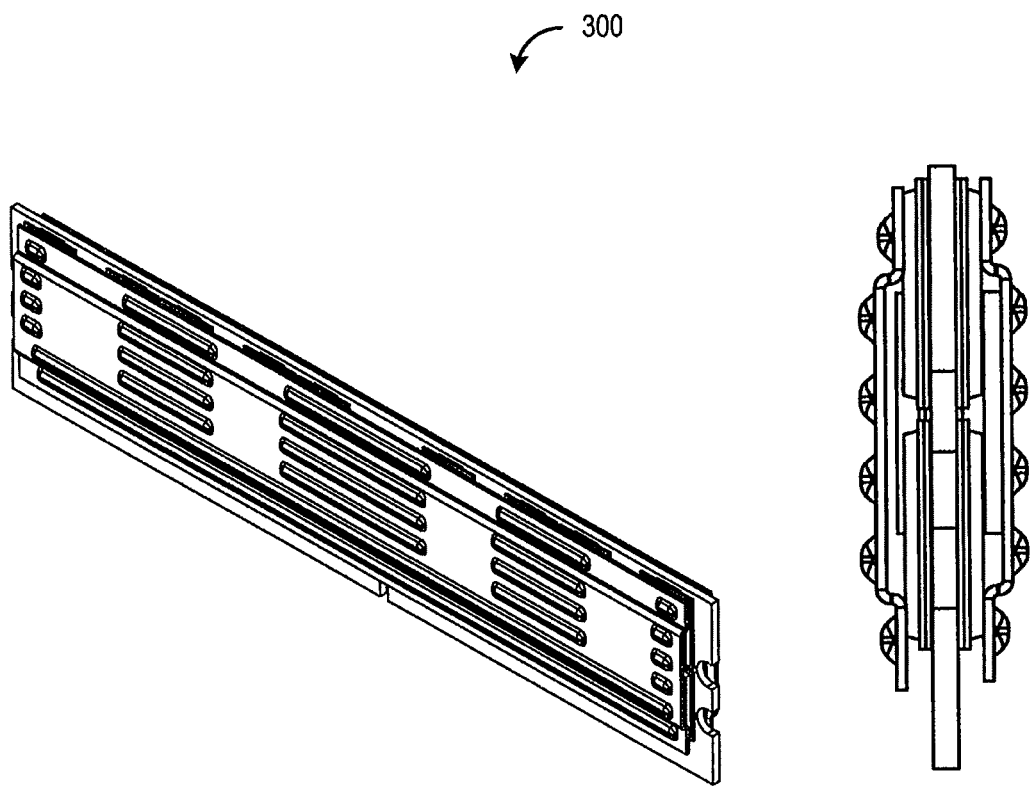
FIGS. 3A through 3C illustrate shapes of a heat spreader plate, according to different embodiments of the present invention.
Figure 3B:
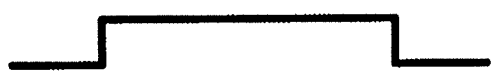
Figure 3C:
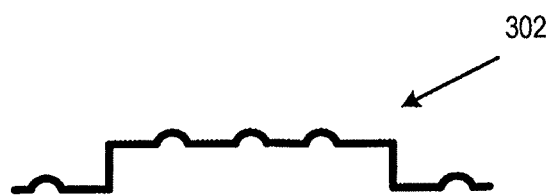

FIG. 2 illustrates an assembled view of a heat spreader module, according to one embodiment of the present invention. The heat spreader module is accomplished using commonly available electronics manufacturing infrastructure and assembly practices. Fastening mechanisms such as the C-clip shown in this embodiment are employed to provide sufficient clamping force and mechanical integrity while minimizing obstruction to thermal dissipation performance. Often thermal interface materials are pressure sensitive and require controlled force application in order to optimize thermal conduction properties. Fastening mechanisms such as the c-clips shown can be designed to maximize heat spreader performance while complying with industry standards for form factor and mechanical reliability In the discussions above, and as shown in FIG. 1, the heat spreader plate 108 may be substantially planar. In other embodiments, the heat spreader plate 108 may be formed into a shape conforming to the contour of the components on the underlying circuit assembly utilizing the stamping or other low cost forming operation. FIGS. 3A through 3C illustrate shapes of a heat spreader plate, according to different embodiments of the present invention. Following the example shown in FIGS. 3A and 3B, the undulation may form an alternating series of high-planes and low-planes. In a preferred embodiment, the high-plane portions and the low-plane portions follow the terrain of the shapes of the components mounted to the PCB 102.

In yet another embodiment, the pattern of embossing substantially follows the undulations. That is, for example, each of the high-plane and low-plane regions may be embossed with one or more embossed segments 302 substantially of the length of the planar region, as shown in FIG. 3C.

FIG. 4 illustrates a heat spreader module with open face embossment areas, according to one embodiment of the present invention. In designs involving embossed patterns with open faces, the ends of the embossed segments may be sufficiently expanded to facilitate more heat spreader surface area contact with the surrounding fluid (air or other gases, or in some cases liquid fluid) as compared with closed-ended embossed segments. These open face embossments may significantly increase thermal performance by enabling exposure of the concave side of the heat spreader plate in addition to the convex while not significantly blocking the available channel area for air flow.

As a comparison, Table 2 below shows the difference in surface area, comparing one side of a flat heat spreader plate to one side of an embossed heat spreader plate having the embossed pattern shown in FIG. 4.

TABLE 2

| Characteristic | Surface area (embossed segments with closed ends) | Surface area (embossed segments with open ends) | Increase in surface area (%) |
|---|---|---|---|
| Open end Embossed | 3175 mm$^2$ | 3175 + 2118 mm$^2$ | 67% |

Figure 5:
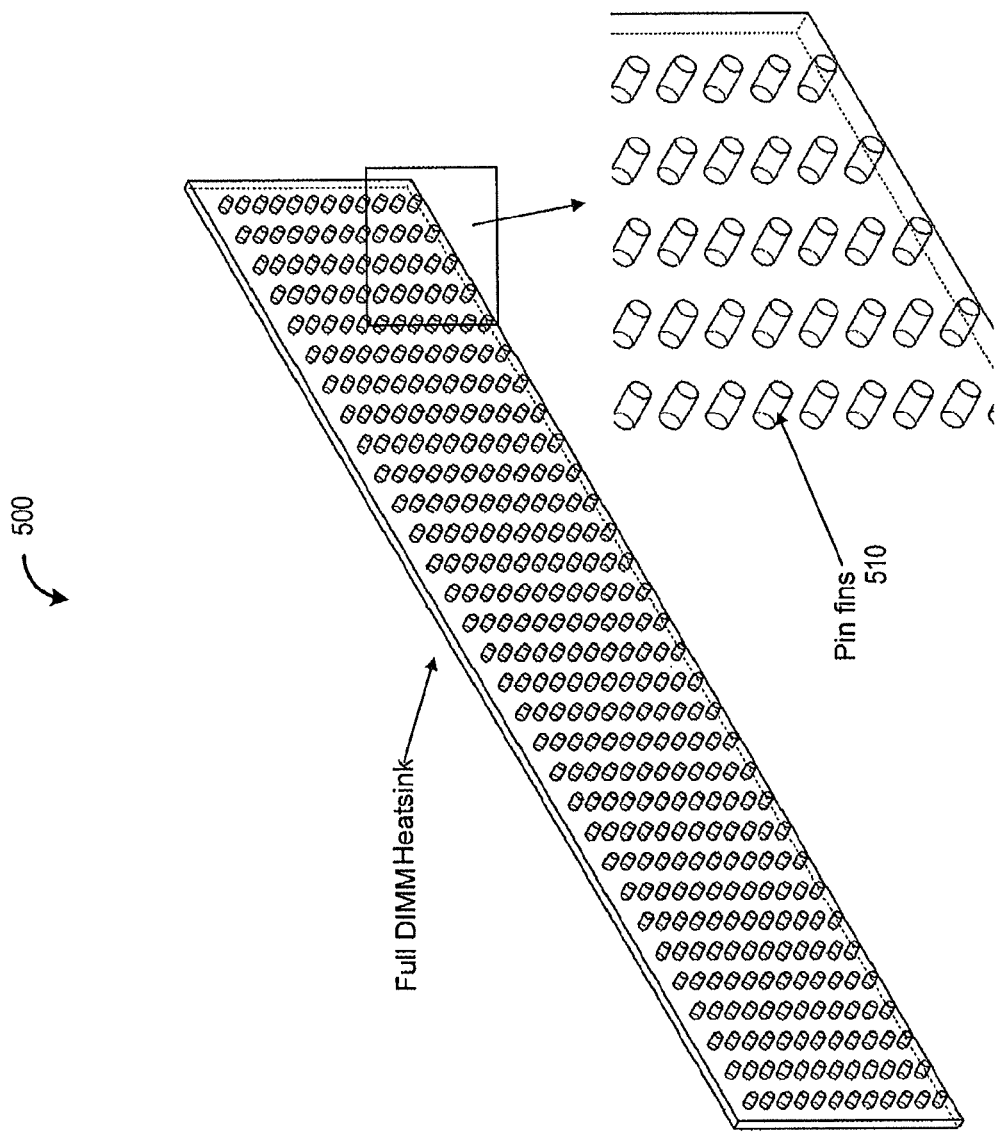
FIG. 5 illustrates a heat spreader module with patterned cylindrical pin array, according to one embodiment of the present invention.

FIG. 5 illustrates a heat spreader module 500 with a patterned cylindrical pin array area, according to one embodiment of the present invention. In designs involving such pin patterns the surface area exposed to air flow can be increased merely by increasing the density of the protrusions. The protrusions may be formed by forging or die-casting.

Figure 6:
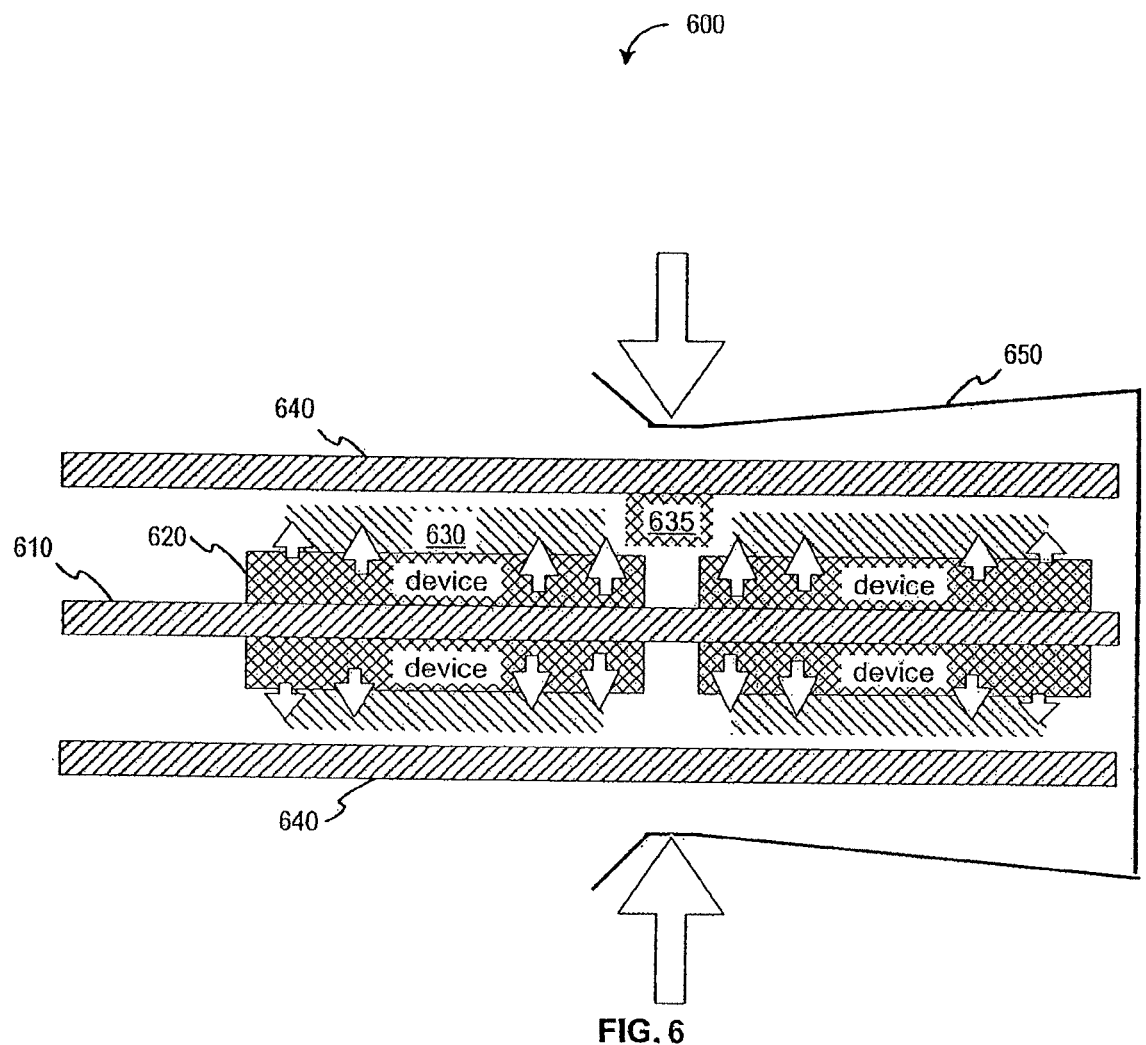
FIG. 6 illustrates an exploded view of a module using PCB heat spreader plates on each face, according to one embodiment of the present invention.

FIG. 6 illustrates an exploded view of a module 600 using PCB heat spreader plates 640 on each face, according to one embodiment of the present invention. This embodiment consists of a heat spreader which is manufactured as an additional separate PCB for each face of the module (or using similar processes to a PCB, i.e. plating metal or thermally conductive material onto the surface of a substantially less conductive substrate). As shown, the module 600 includes electronic components mounted on a two-sided PCB 610. It must be noted that, typically, the heat spreader plates 640 require mechanical stiffness to distribute the clamping forces from localized contact points using fasteners 650 (also referred to herein as clamps and/or clips) to a TIM 630 at each heat source (e.g., ASIC, DRAM, FET, etc). Given a layout with a relatively low concentration of heat sources (e.g. on a DIMM), more, and/or thicker heat spreader material (e.g. copper or aluminum) is required to provide mechanical stiffness than would be needed simply to carry the heat away. The PCB heat spreader plates 640 use a non-metallic core material to provide the required stiffness in place of the usual solid copper or aluminum heat spreader plates. The PCB heat spreader plates 640 might have devices 635 mounted on one or both sides. Some examples of the PCB heat spreader plates are described in greater detail in FIGS. 7, 8A, and 8B. The entire assembly 600 may be squeezed together with the fastener 650, applying forces on the faces of the assembly. Use of a compressible TIM permits the PCB heat spreader plates 640 to deform somewhat under the clamping pressures while still maintaining sufficient thermal coupling. In some embodiments, the PCB heat spreader plates 640 may be formed of a fiberglass or phenolic PCB material and may employ plated through-holes to further distribute heat.

The heat spreader module 600 may utilize a low cost material to fabricate the PCB heat spreader plates 640. The low cost material may have low thermal conductivity as a "core" to provide the desired mechanical properties (stiffness, energy absorption when a module is dropped), while a thin metal coating on one or both sides of PCB(s) 640 provides the required thermal conductivity. Thermal conduction from one face of the core to the other is provided by holes drilled or otherwise formed in the core which are then plated or filled with metal (described in greater detail in FIG. 7). The advantage of this method of construction is that the amount of metal used can be only the minimum that is required to provide the necessary thermal conductivity, while the mechanical properties are controlled independently by adjusting the material properties and dimensions of the core. The use of standard PCB manufacturing processes allows this type of heat spreader to include patterned thermally conductive features that allow some parts of the heat spreader module 600 to be effectively isolated from others. This allows different parts of the heat spreader module 600 to be maintained at different temperatures, and allows measurement of the temperature at one location to be taken using a sensor attached elsewhere (described in greater detail in FIG. 9).

Figure 7:
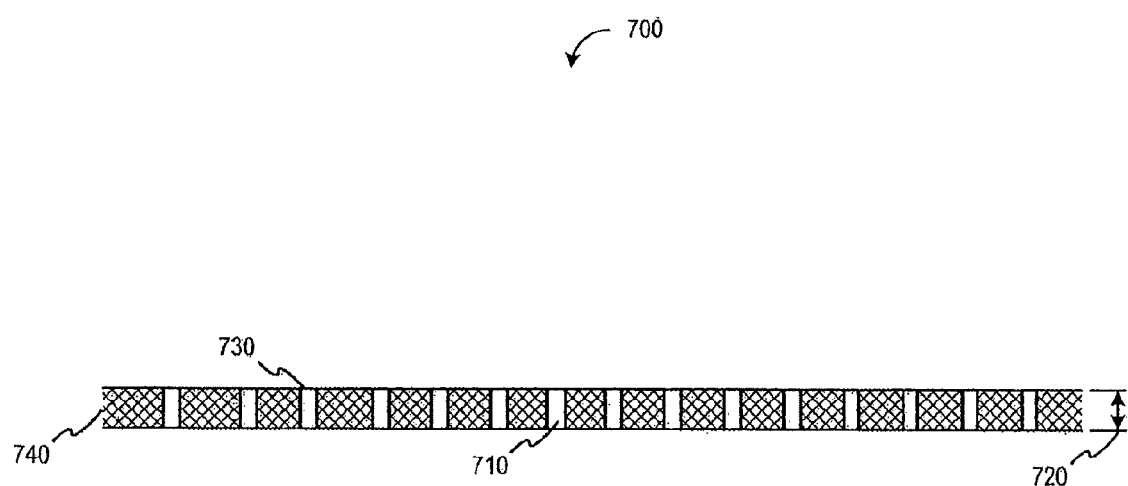
FIG. 7 illustrates a PCB stiffener with a pattern of through-holes, according to one embodiment of the present invention.

FIG. 7 illustrates a PCB stiffener 700 with a pattern of through-holes 710, according to one embodiment of the present invention. The PCB stiffener 700 may be used as the PCB heat spreader plates 640 illustrated in FIG. 6. As shown, plated through holes 710 may be purposefully formed through the PCB 700. In such an embodiment, there may be many variations. For example, a thickness 720 of the PCB 700 may be selected according to the mechanical stiffness properties of the PCB material. Furthermore, a size of the through-holes 710, thickness of the walls between the through-holes 710, dimensions and composition of the though-hole plating, and surface plating thickness 730 may affect the thermal spreading resistance. The through-holes 710 may be plated shut, or be filled with metal (e.g. copper) or non-metal compositions (e.g. epoxy). Given these independently controlled variables, various embodiments support separate tuning of mechanical stiffness (e.g. based on PCB thickness and materials used, such as, for example phenolic, fiberglass, carbon fiber), through-thickness conductivity (e.g. based on number and size of the plated through-holes 710), and planar conductivity (e.g. based on thickness of copper foil and plating).

Adapting a PCB to be used as the heat spreader minimizes coefficient of thermal expansion (CTE) mismatch between the heat spreader (e.g., the PCB 640 or the PCB stiffener 700) and the core PCB (e.g., the PCB 610) that the devices being served are attached to (e.g., the electronic components 620). As a result, warpage due to temperature variation may be minimized, and the need to allow for relative movement at the interface between the electronic components and the heat spreader may be reduced.

Figure 8A:
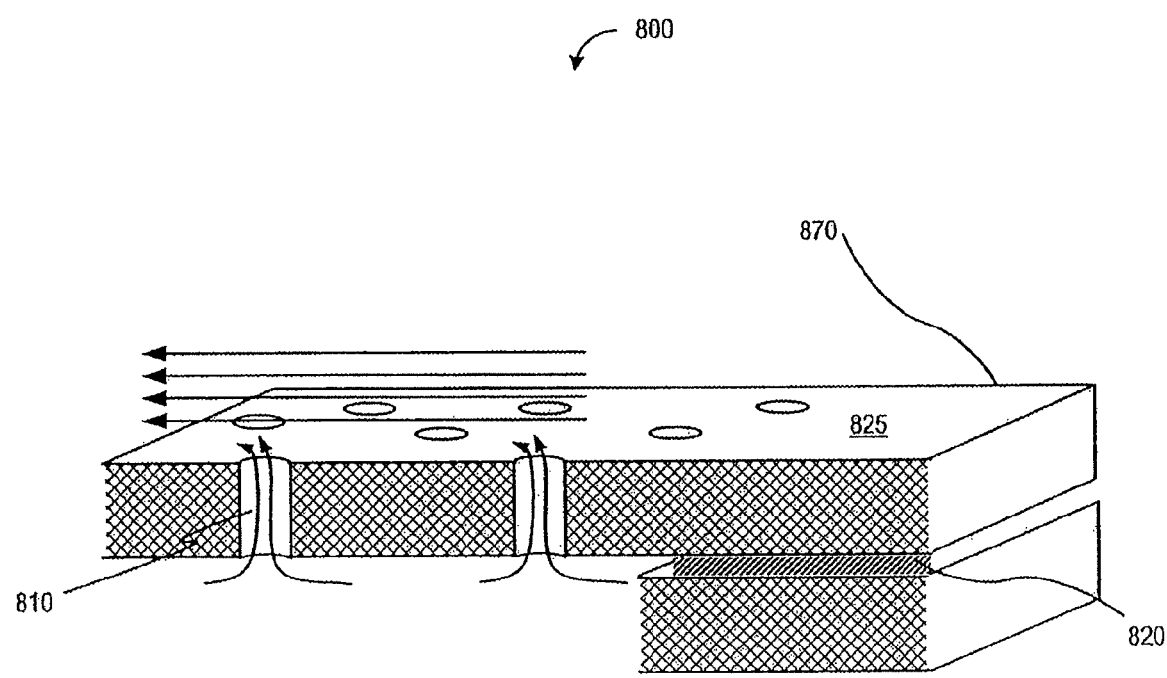
FIG. 8A illustrates a PCB stiffener with a pattern of through holes allowing air flow from inner to outer surfaces, according to one embodiment of the present invention.

FIG. 8A illustrates a PCB stiffener 870 with a pattern of through holes allowing air flow from inner to outer surfaces, according to one embodiment of the present invention. The PCB stiffener 870 may be used as the PCB heat spreader plates 640 illustrated in FIG. 6. As shown in FIG. 8A, unfilled plated through-holes 810 may be used to allow the airflow from the space under the PCB 870 to pass out through the unfilled holes due to the air pressure differential. Top surface 825 and bottom surface (not shown in FIG. 8A) are thermally conductive surfaces, and acting together with the TIM 820 contribute to reducing effective total thermal resistance of the PCB 870, thus improving the heat spreading effectiveness of the assembly.

Figure 8B:
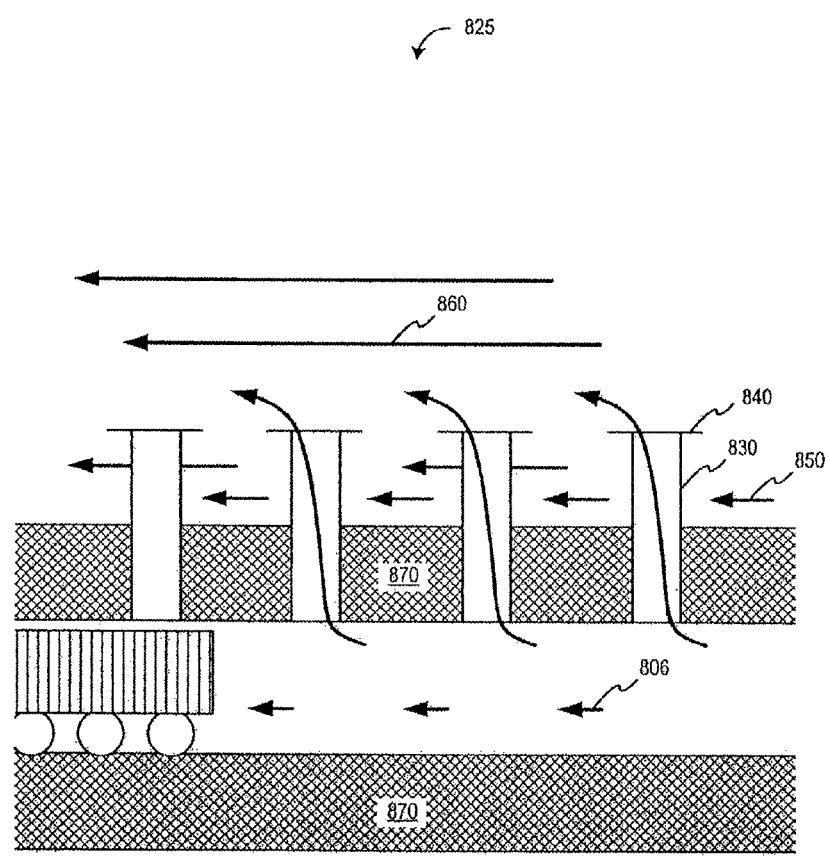
FIG. 8B illustrates a PCB stiffener with a pattern of through holes with a chimney, according to one embodiment of the present invention.

In fact, and as shown in FIG. 8B, multiple layers of substrate material used to make the PCB 870 may be included and then some thickness (e.g. one or more layers) of the substrate material can be removed by acid or melting to leave the via structures as hollow pins 830 protruding above the surface of the remaining layers. Because the top end 840 of the hollow pins 830 is out of the boundary layer of slow air near the surface 850, there is a "smokestack effect" which increases the air pressure differential between the pressure due to airflow 806 relative to the pressure due to airflow 860, leading to increased airflow through the hollow pins 830, and thus reducing the total thermal resistance of the heat spreader to the air.

Figure 9:
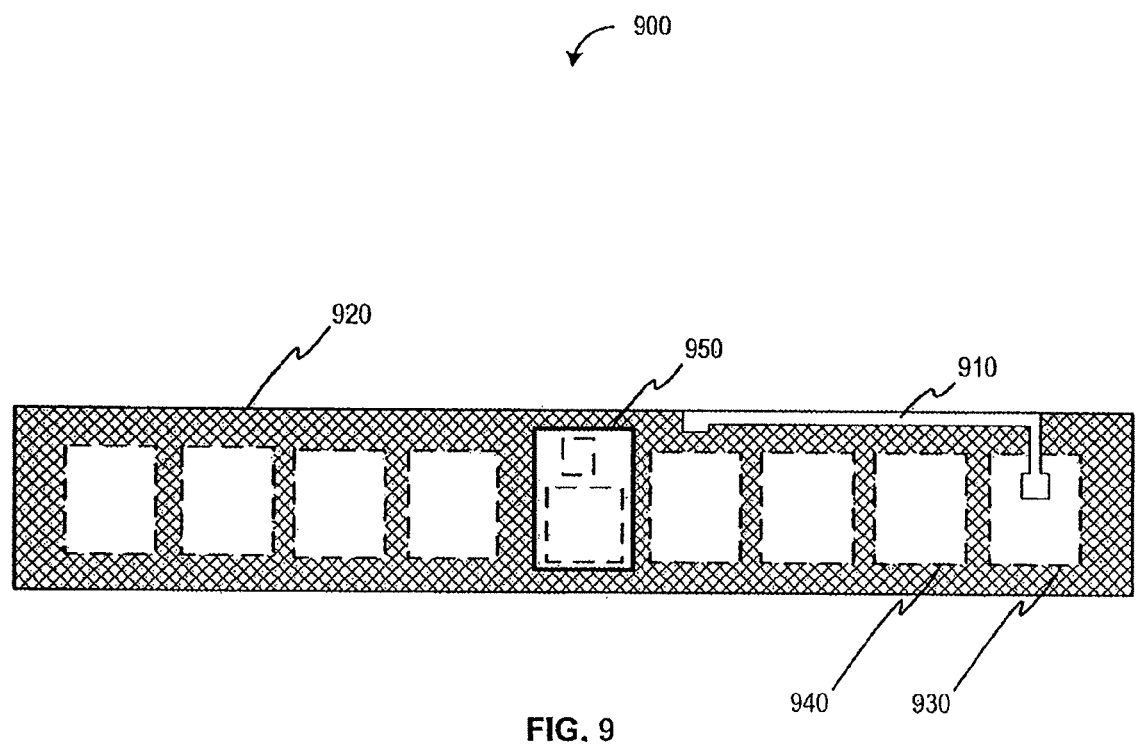
FIG. 9 illustrates a PCB type heat spreader for combining or isolating areas, according to one embodiment of the present invention.

FIG. 9 illustrates a heat spreader for combining or isolating areas, according to one embodiment of the present invention. As shown, thermally conductive materials may be shaped into traces 910 disposed on a substrate 920 so as to thermally combine certain areas (and/or thermally separate others) so that a "hot" component 930 does not excessively heat immediately adjacent components 940. Additionally, any of the traces etched into the board might be used to carry temperature information from one location to another, for example, to measure the temperature of a hot component with a thermal diode that makes contact with the heat spreader at another location on the board. In effect, the board is used as a "thermal circuit board" carrying temperatures instead of voltages. This works especially well in situations where the thermal conductivity of the transmitting material is greater than that of material forming the PCB. In embodiments demanding a separate area for components with different temperature limits or requiring separate temperature measurement, the aforementioned techniques for distributing or transmitting temperatures, or thermally combining or thermally isolating areas might be used.

The embodiments shown in FIGS. 6 through 9 may be employed in any context of heat spreader module designs, including the contexts of FIGS. 1-5.

FIGS. 10A-10D illustrate heat spreader assemblies showing air flow dynamics, according to various embodiments of the present invention. As shown in FIGS. 10A and 10C, in some cases functioning modules (e.g. DIMMS on motherboards) may be seated in a socket electrically connected to the motherboard, and in cases where multiple DIMMS are arranged in an array as shown, the one or more DIMMS may be disposed in an interior position, that is, between one or more other sockets. FIG. 10B shows a side view of such a situation. As may be seen, the airflow over the surfaces of the interior functioning module is unshaped. According to one embodiment of the present invention, in such a case, the airflow to the one or more interior DIMMS may be made more laminar in some sections, or made more turbulent in some sections or otherwise enhanced by populating the neighboring sockets with a shaped stand-off card, as shown in FIGS. 10C and 10D. As may be seen, the airflow over the surfaces of the interior functioning module is shaped as a consequence of the shaped stand-off card. Of course, the shaped stand-off card might be as simple as is shown in FIG. 10D, or it might include a funnel shape, or a convex portion or even an airfoil shape.

Figure 11A:
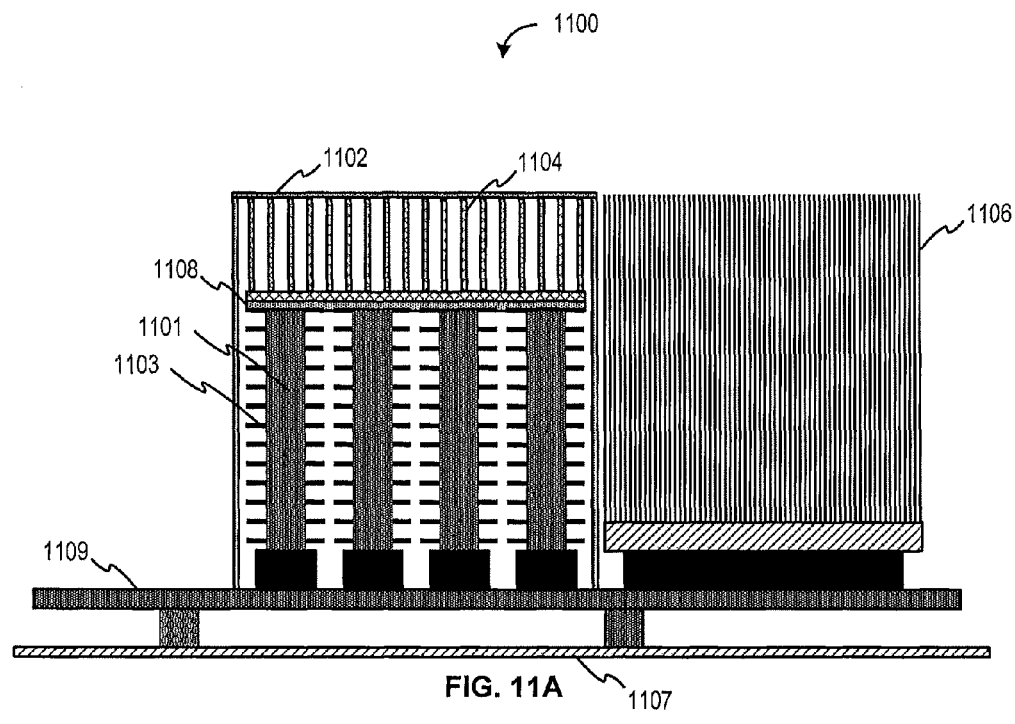
FIGS. 11A-11D illustrate heat spreaders for memory modules, according to various embodiments of the present invention.
Figure 11B:
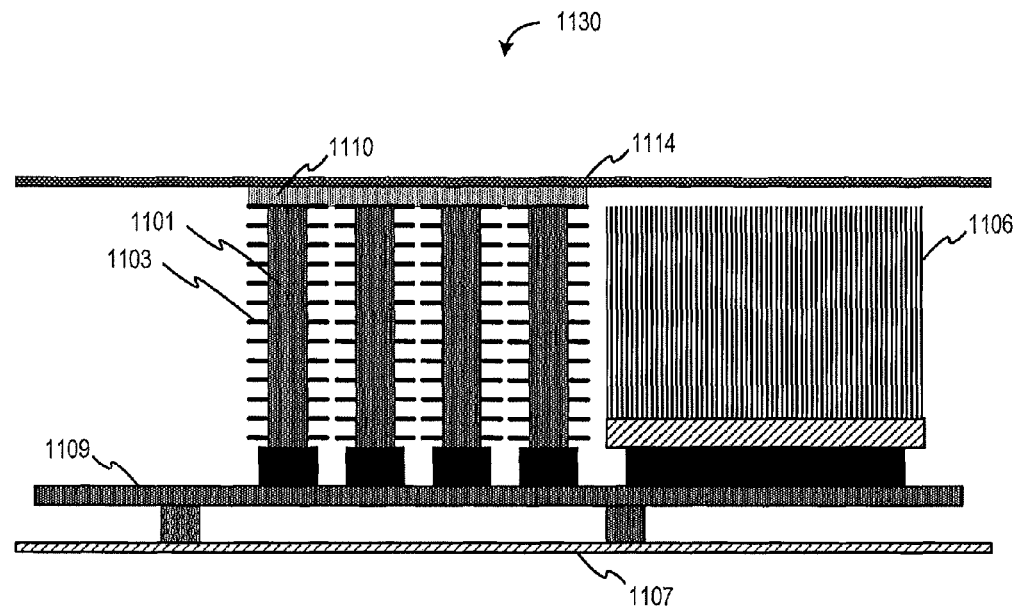
Figure 11C:
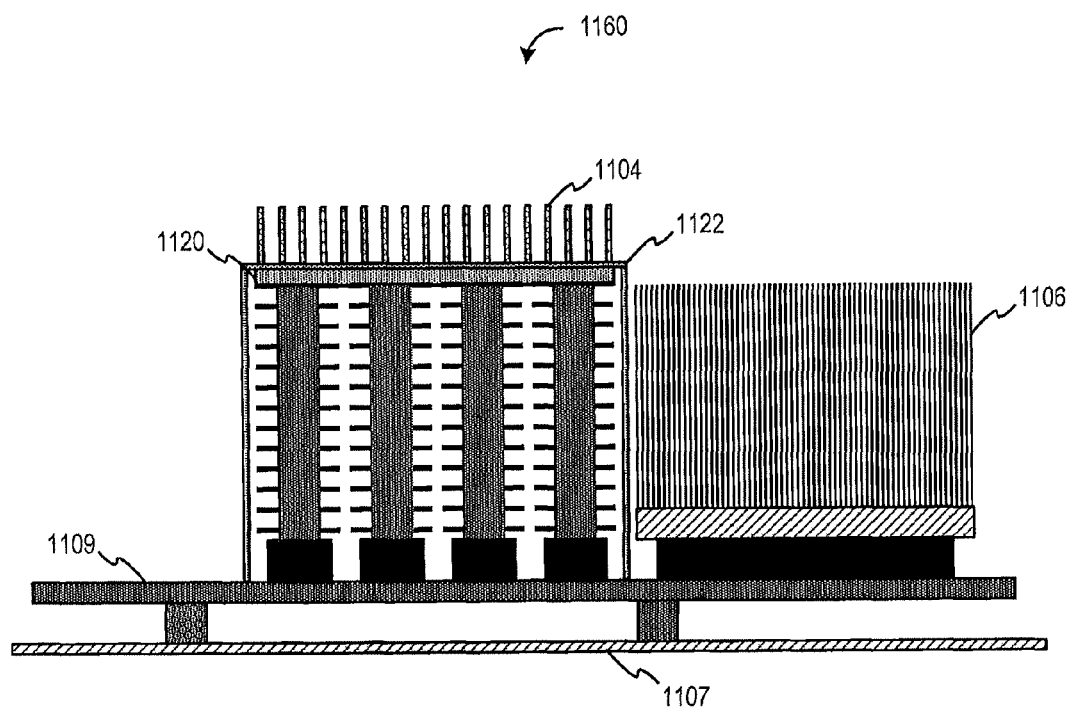
Figure 11D:
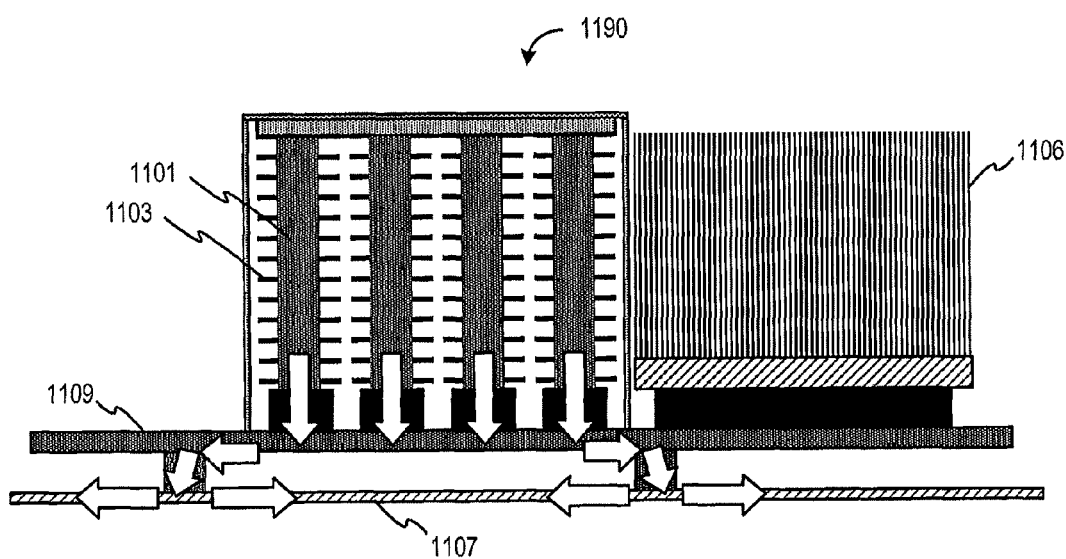

FIGS. 11A-11D illustrate various embodiments of heat spreaders for a memory module. The embodiments shown in FIGS. 11A through 11D may be employed in any context, including the contexts of FIGS. 1-10D. In fact, memory module 1101 depicts a PCB or a heat spreader module assembly in the fashion of assembly 100, or 200 or 500, or 600, or any other PCB assembly as discussed herein. In one embodiment, the memory module 1101 comprises a DIMM. Moreover the element 1103 depicts an embossing (e.g. 116) or pin fin (e.g. 510) or even a hollow pin 830. In some embodiments, a memory module 1101 may be an assembly or collection of multiple memory devices, or in some embodiments, a memory module 1101 may be embodied as a section on a PCB or motherboard, possibly including one or more sockets. FIG. 11A shows a group of memory modules 1101 enclosed by a duct 1102. In the exemplary embodiments shown in FIG. 11A-11D, the memory modules section might be mounted on a motherboard or other printed circuit board, and relatively co-located next to a processor, which processor might be fitted with a heat sink 1106. This assembly including the memory module(s), processor(s) and corresponding heat sinks might be mounted on a motherboard or backplane 1109, and enclosed with a bottom-side portion 1107 of a housing (e.g., computer chassis or case). The duct 1102 encloses the memory module section, and encloses a heat sink assembly 1104 disposed atop the memory modules 1101, possibly including TIM 1108 between the memory modules 1101 and the heat sink assembly 1104. FIG. 11B shows a side view of a section of a motherboard, and depicting the memory modules 1101 in thermal contact with a top-side portion 1114 of a housing, possibly including TIM 1110. FIG. 11C shows a memory module enclosed by a duct 1102. The duct 1122 encloses the memory module section. The heat sink assembly 1104 may be disposed atop the duct 1122, possibly including TIM 1120 between the memory modules 1101 and the duct 1122. FIG. 11D shows a memory module enclosed by a duct. This embodiment exemplifies how heat is carried from the DIMMS to the bottom-side portion 1107 of the housing through any or all structural members in thermal contact with the bottom-side of the housing.

While the foregoing is directed to embodiments of the present invention, other and further embodiments of the invention may be devised without departing from the basic scope thereof, and the scope thereof is determined by the claims that follow.

What is claimed is:

1. An apparatus comprising:
  a motherboard;
  a plurality of sockets electrically connected to the motherboard;
  a plurality of memory modules mounted in the plurality of sockets; and
  a duct encompassing the plurality of memory modules,
  wherein each of the plurality of memory modules comprises:
    a first printed circuit board (PCB) having a first side and a second side,
    a first set of electronic components disposed on the first side of the first PCB,
    a first thermal interface material (TIM) thermally coupled to the first set of electronic components,
    a first heat spreader plate thermally coupled to the first TIM and adapted to dissipate thermal heat generated by the first set of electronic components, a second set of electronic components disposed on the second side of the first PCB, a second TIM thermally coupled to the second set of electronic components, and a second heat spreader plate thermally coupled to the second TIM and adapted to dissipate thermal heat generated by the second set of electronic components.

2. The apparatus of claim 1, further comprising a third TIM thermally coupled to the plurality of memory modules.

3. The apparatus of claim 2, further comprising a heat sink assembly thermally coupled to the third TIM.

4. The apparatus of claim 2, wherein the third TIM is disposed between the plurality of memory modules and the duct, and further comprising a heat sink assembly thermally coupled to the duct.

5. The apparatus of claim 2, further comprising a housing thermally coupled to the third TIM and encompassing the motherboard, the plurality of memory modules, and the duct.

6. The apparatus of claim 5, wherein the housing comprises a computer chassis.

7. The apparatus of claim 1, further comprising a processor electrically connected to the motherboard.

8. The apparatus of claim 7, further comprising a heat sink thermally coupled to the processor and adapted to dissipate thermal heat generated by the processor.

9. The apparatus of claim 1, wherein the plurality of memory modules include dual in-line memory modules (DIMMs).

10. The apparatus of claim 1, wherein the first and second set of electronic components include dynamic random access memory chips.

11. The apparatus of claim 1, wherein the first and second heat spreader plates include an embossed pattern.

12. The apparatus of claim 11, wherein the embossed pattern comprises one or more long embossed segments that run substantially an entire length of longitudinal edges of the first and second heat spreader plates.

13. The apparatus of claim 11, wherein the embossed pattern comprises two or more short embossed segments such that, cumulatively, the two or more short embossed segments run substantially an entire length of longitudinal edges of the first and second heat spreader plates.

14. The apparatus of claim 11, wherein the embossed pattern comprises a patterned cylindrical pin array.

15. The apparatus of claim 11, wherein the embossed pattern comprises fins protruding out of the heat spreader plate.

16. The apparatus of claim 1, wherein the first heat spreader plate comprises a second PCB and the second heat spreader plate comprises a third PCB.

17. The apparatus of claim 16, wherein the second and third PCBs include an embossed pattern.

18. The apparatus of claim 17, wherein the embossed pattern comprises fins protruding out of the second and third PCBs.

\* \* \* \* \*